(12) United States Patent
Shimomura et al.

(10) Patent No.: US 8,009,456 B2
(45) Date of Patent: Aug. 30, 2011

(54) RESISTANCE CHANGE TYPE MEMORY

(75) Inventors: Naoharu Shimomura, Sagamihara (JP); Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 64 days.

(21) Appl. No.: 12/350,477

(22) Filed: Jan. 8, 2009

(65) Prior Publication Data
US 2009/0180310 A1    Jul. 16, 2009

(30) Foreign Application Priority Data
Jan. 11, 2008    (JP) ................................ 2008-004452

(51) Int. Cl.
  *G11C 11/00* (2006.01)
(52) U.S. Cl. ......................... 365/148; 365/158; 365/163
(58) Field of Classification Search .................. 365/148, 365/163, 158, 230.06, 175, 46, 131, 51, 63, 365/185.21
See application file for complete search history.

(56) References Cited

U.S. PATENT DOCUMENTS

| 6,256,223 | B1 | 7/2001 | Sun |
| 6,946,712 | B2 | 9/2005 | Asao |
| 2008/0258129 | A1* | 10/2008 | Toda ................................. 257/5 |
| 2009/0034320 | A1* | 2/2009 | Ueda ............................ 365/148 |

FOREIGN PATENT DOCUMENTS

| CN | 1714407 A | 12/2005 |
| WO | WO 2006/055482 | 5/2006 |

OTHER PUBLICATIONS

Chinese Office Action issued Nov. 22, 2010, in Chinese Patent Application No. 200910001620.6 with English translation.
Office Action issued Sep. 30, 2010, in Korean Patent Application No. 10-2009-1453 (submitting English translation only, Korean Version previously filed).

* cited by examiner

*Primary Examiner* — Dang T Nguyen
(74) *Attorney, Agent, or Firm* — Oblon, Spivak, McClelland, Maier & Neustadt, L.L.P.

(57) ABSTRACT

A resistance change type memory includes first, second and third drive lines, a resistance change element having one end connected to the third drive line, a first diode having an anode connected to the first drive line and a cathode connected to other end of the first resistance change element, a second diode having an anode connected to other end of the first resistance change element and a cathode connected to the second drive line, and a driver/sinker which supplies a write current to the resistance change element. A write control circuit is arranged such that when first data is written, the write current is caused to flow in a direction from the first drive line to the third drive line, and when second data is written, the write current is caused to flow in a direction from the third drive line to the second drive line.

22 Claims, 25 Drawing Sheets

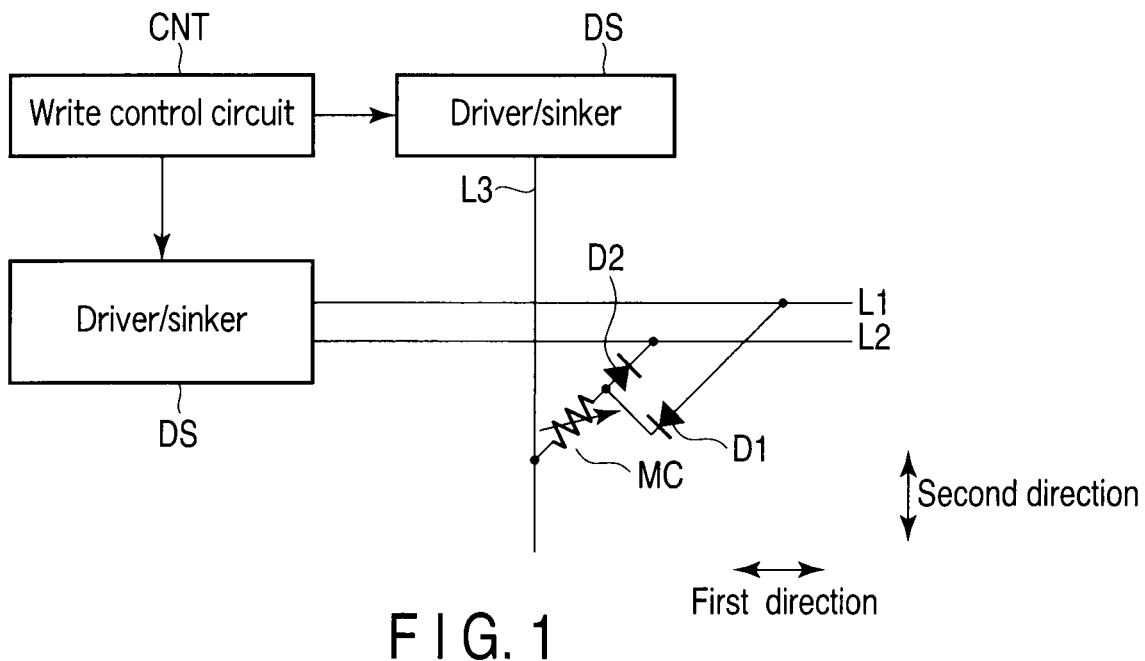
F I G. 1
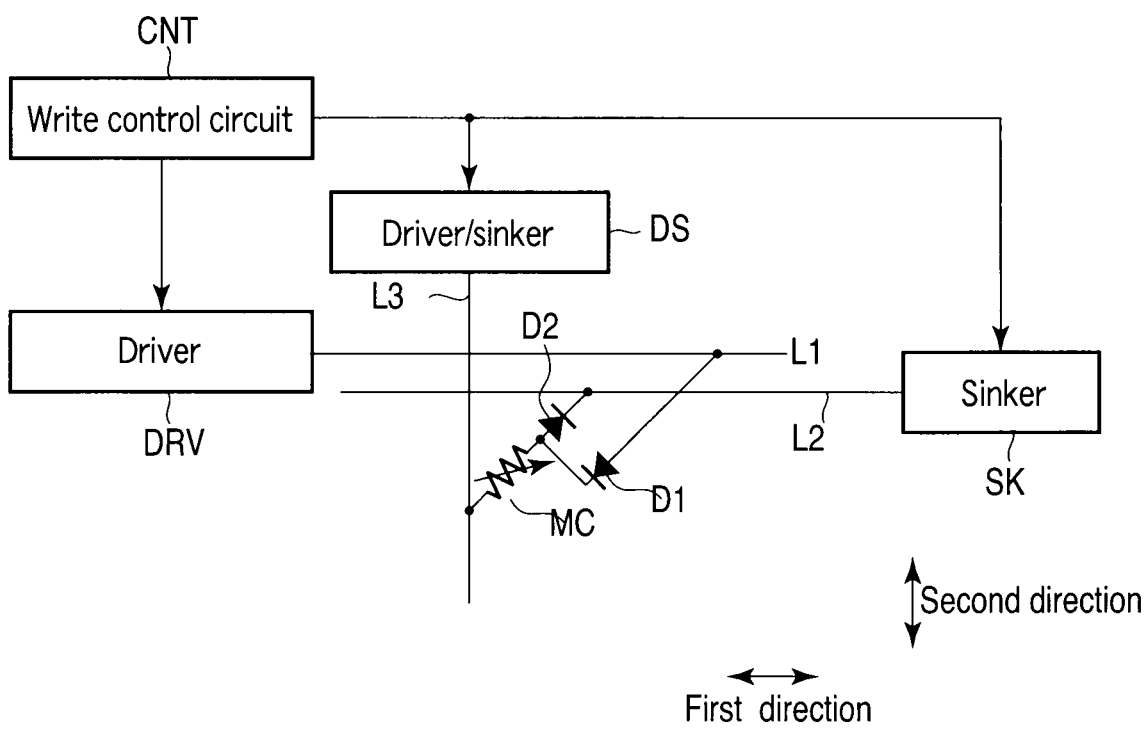
F I G. 2

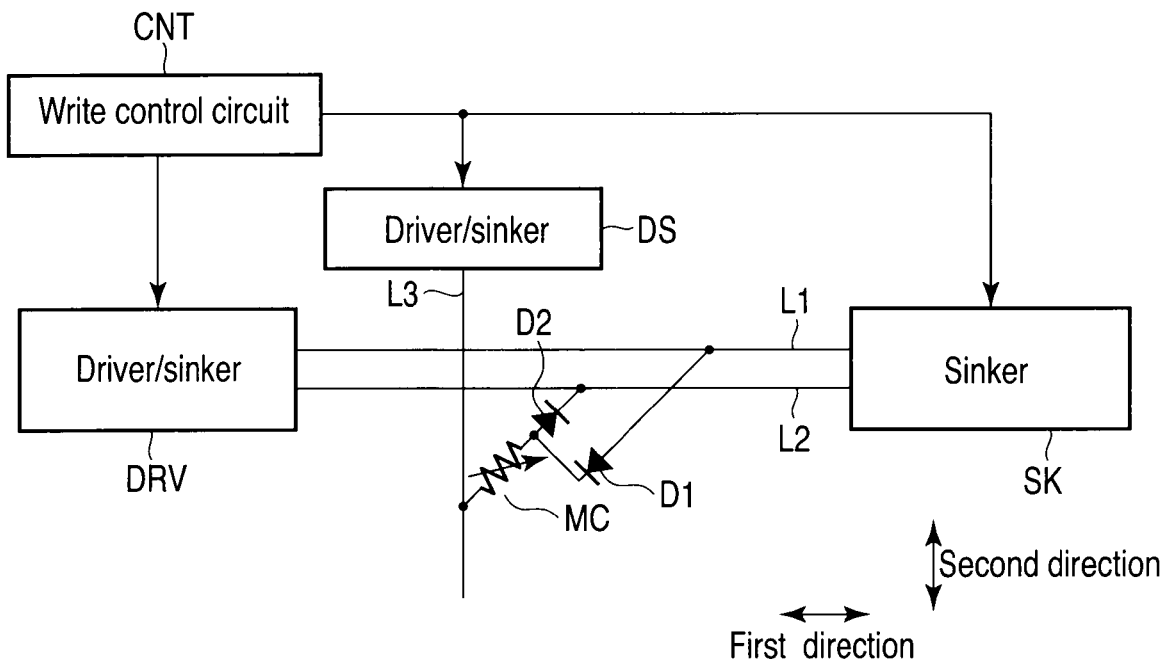
F I G. 3
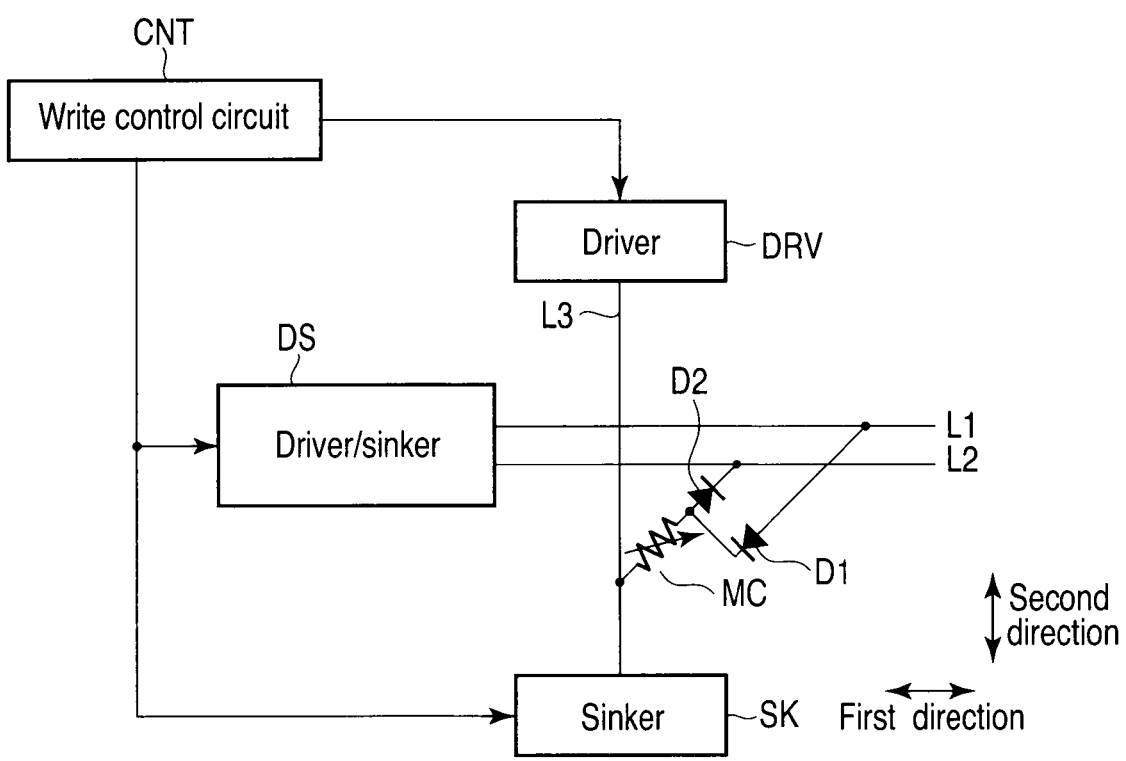
F I G. 4

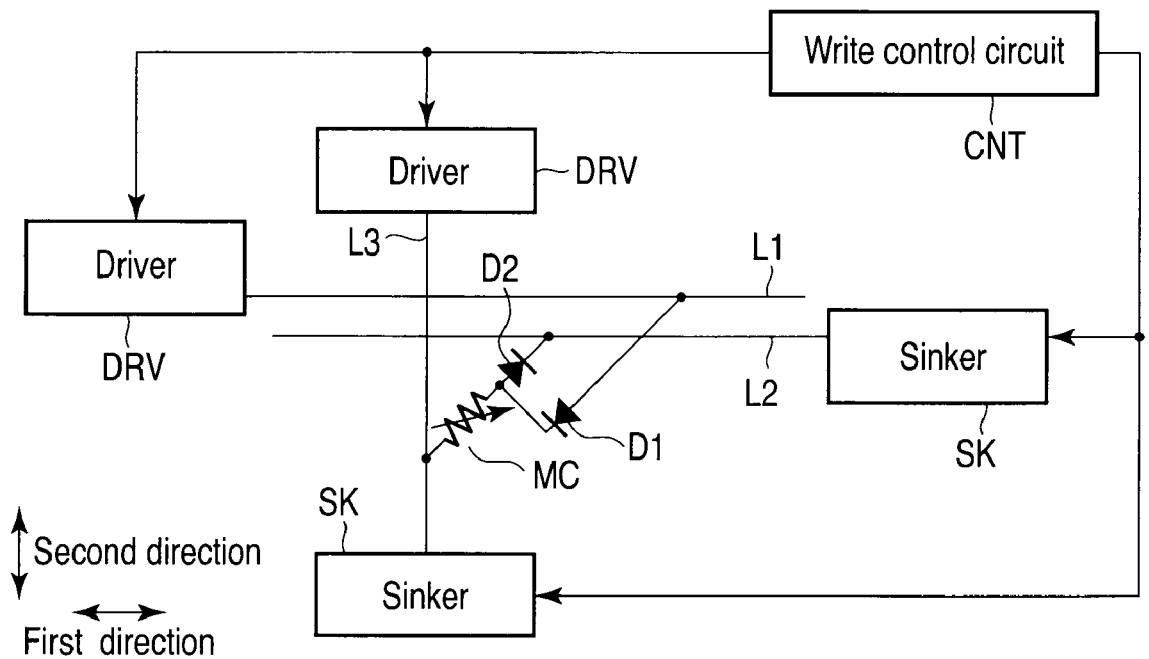
F I G. 5
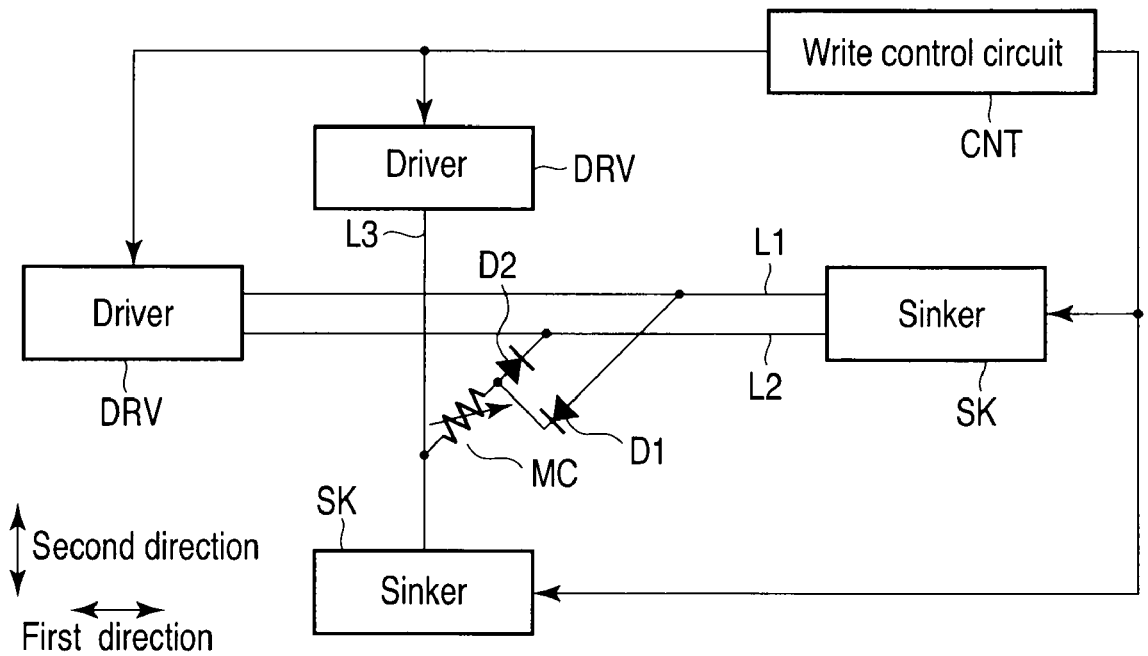
F I G. 6

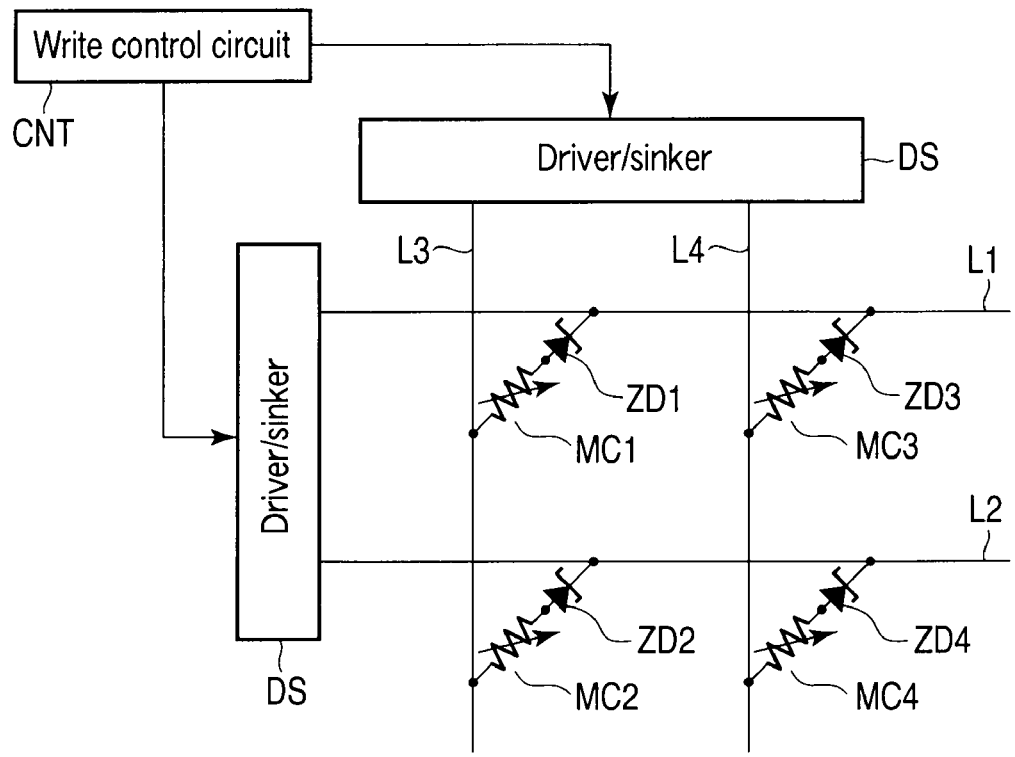
F I G. 7
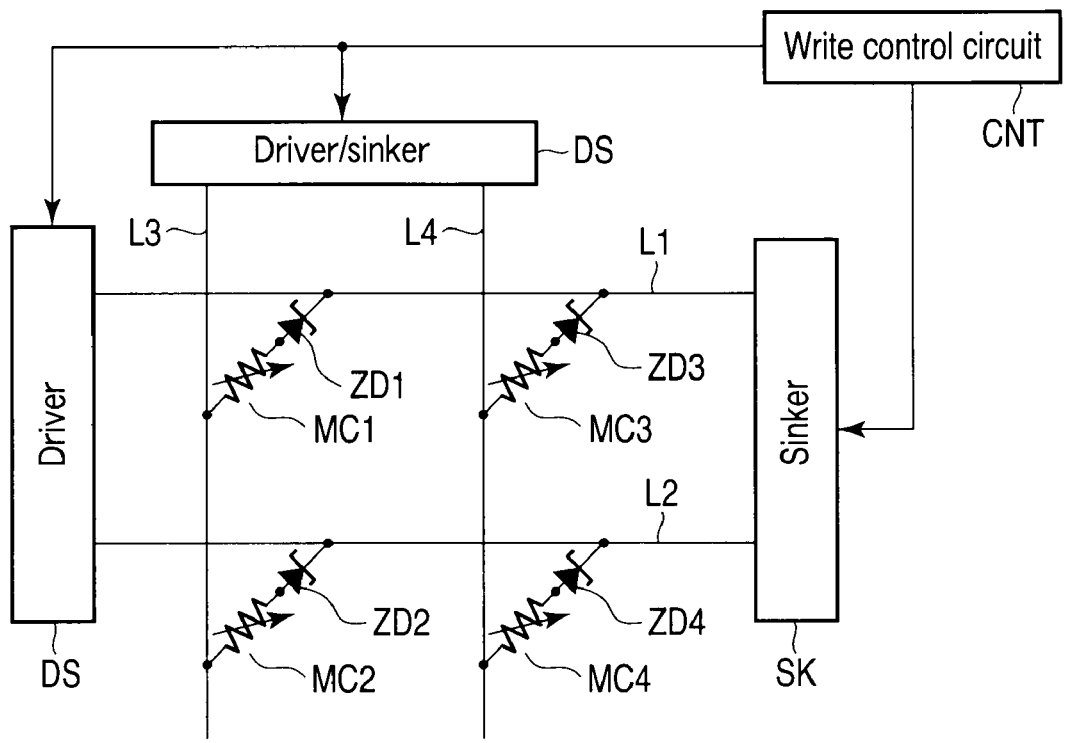
F I G. 8

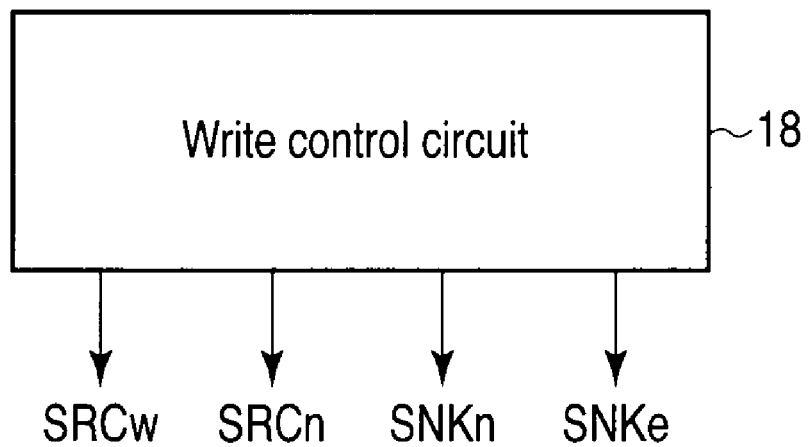
F I G. 13
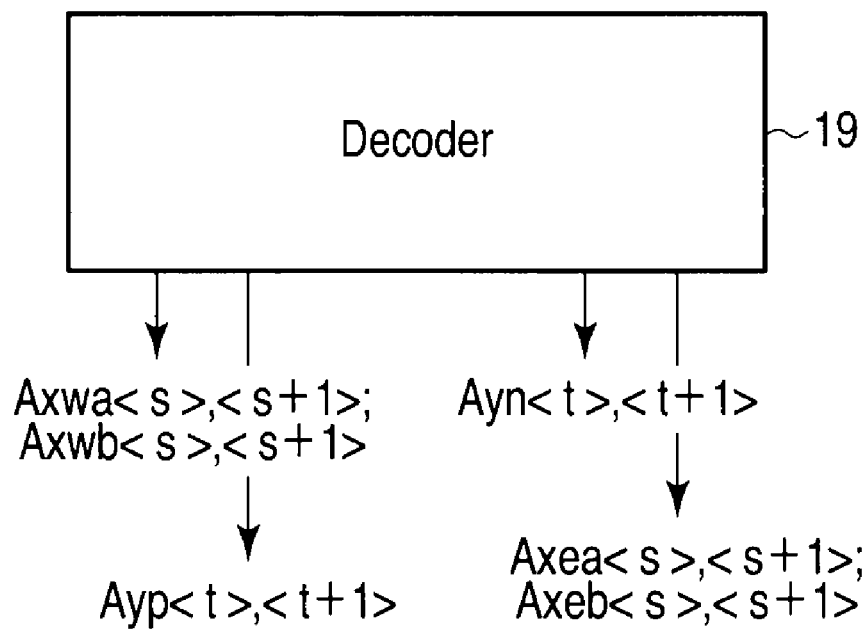
F I G. 14

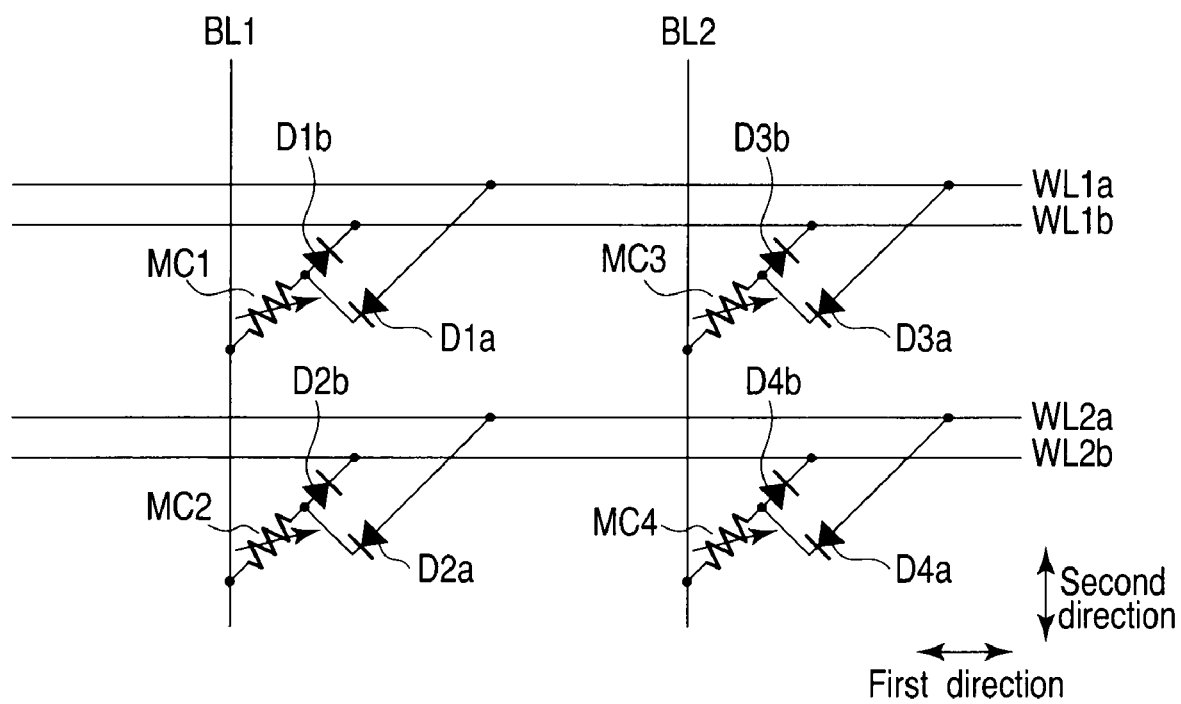
F I G. 15

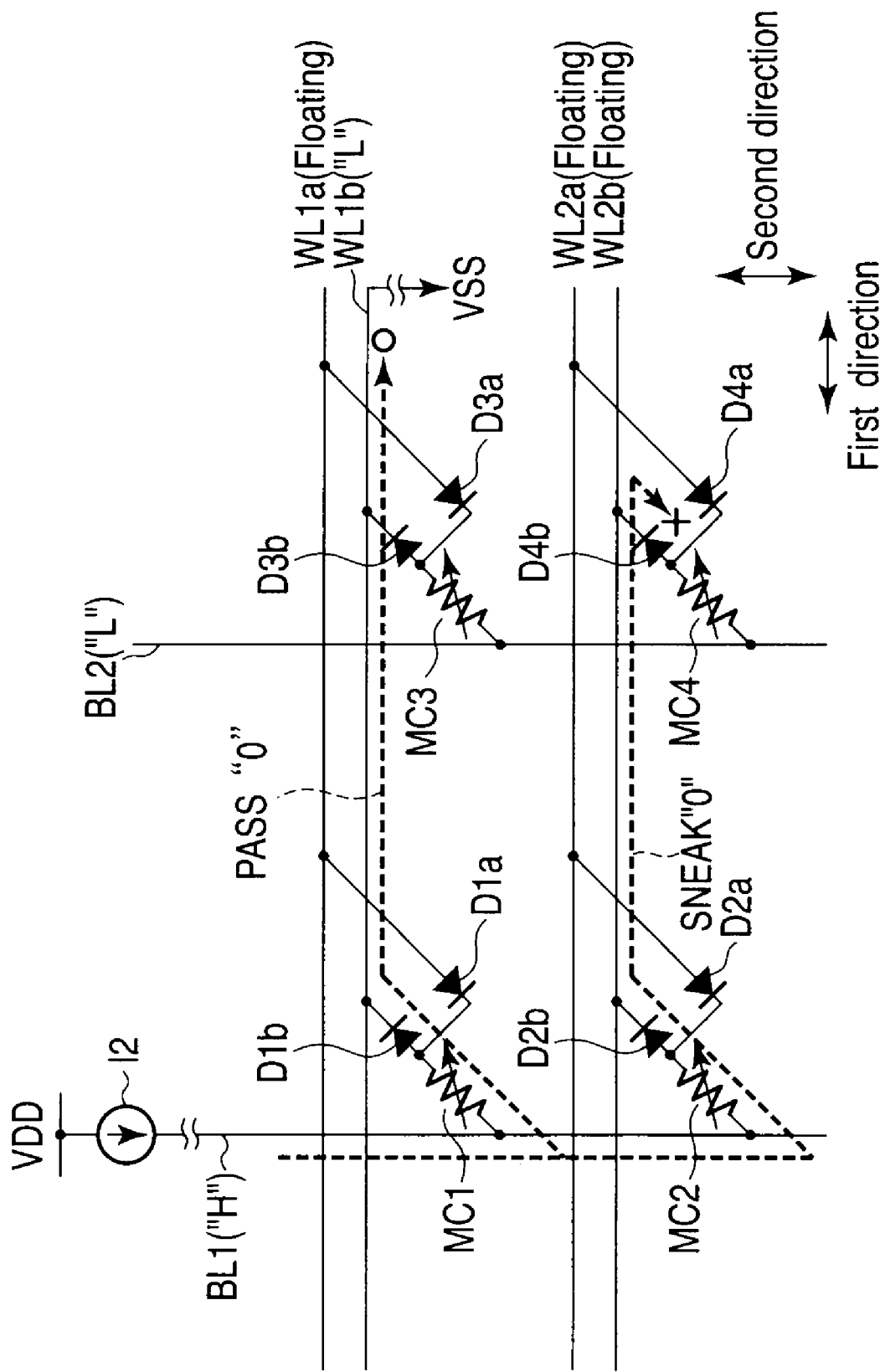
F I G. 17

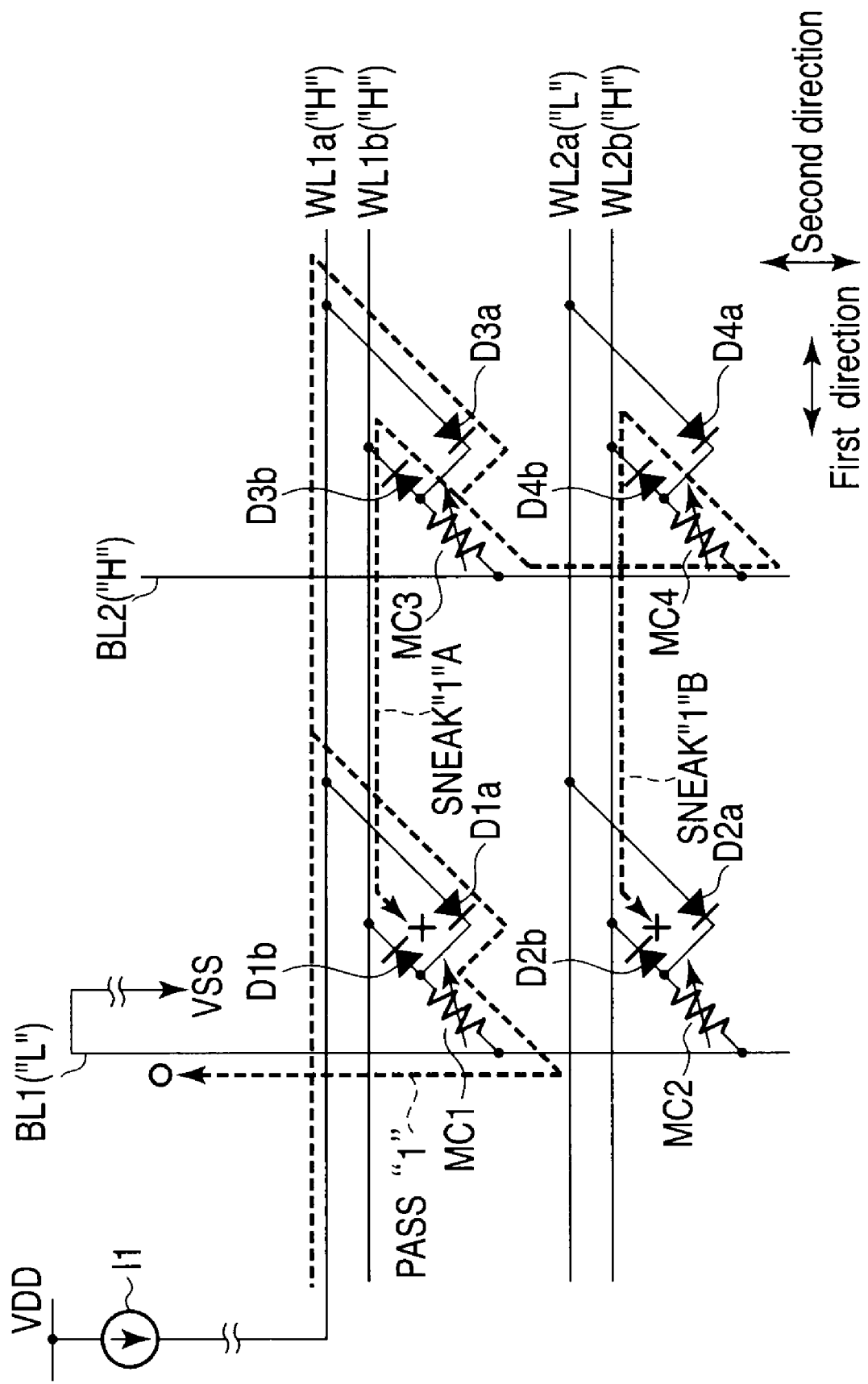
F I G. 18

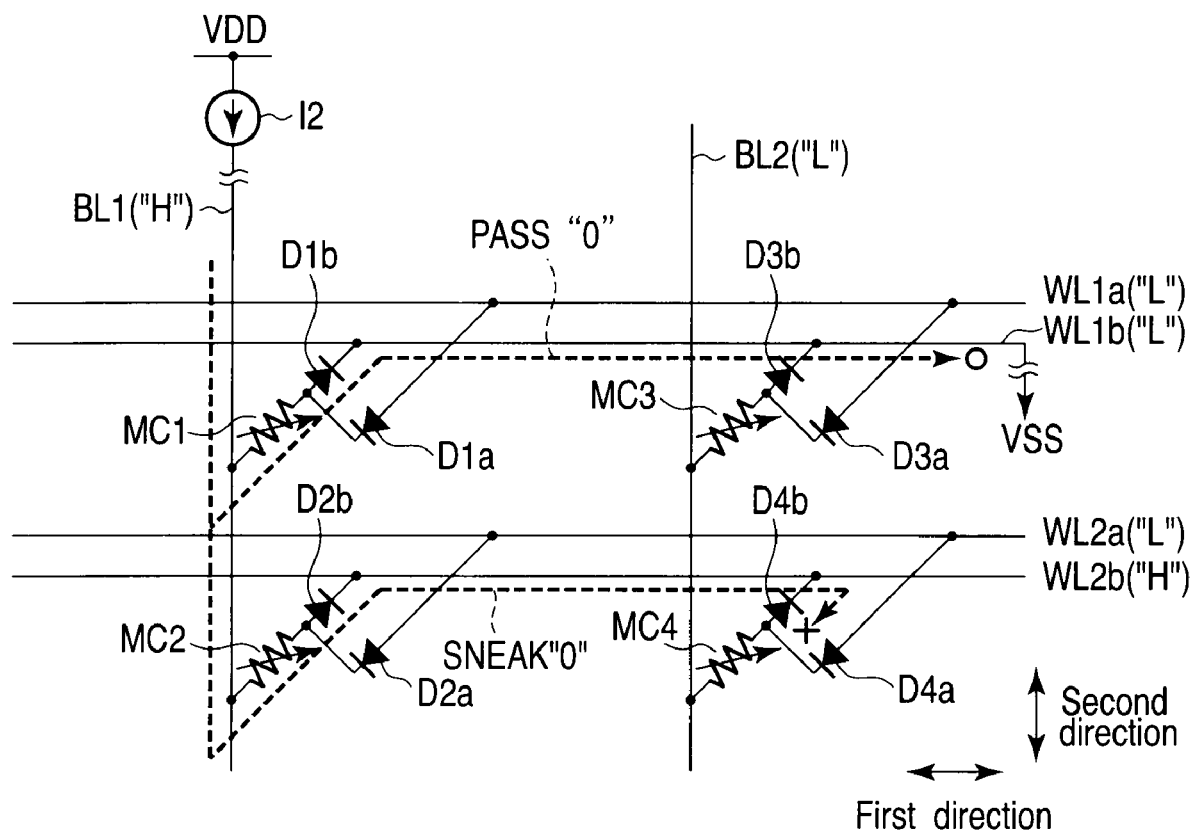
F I G. 19

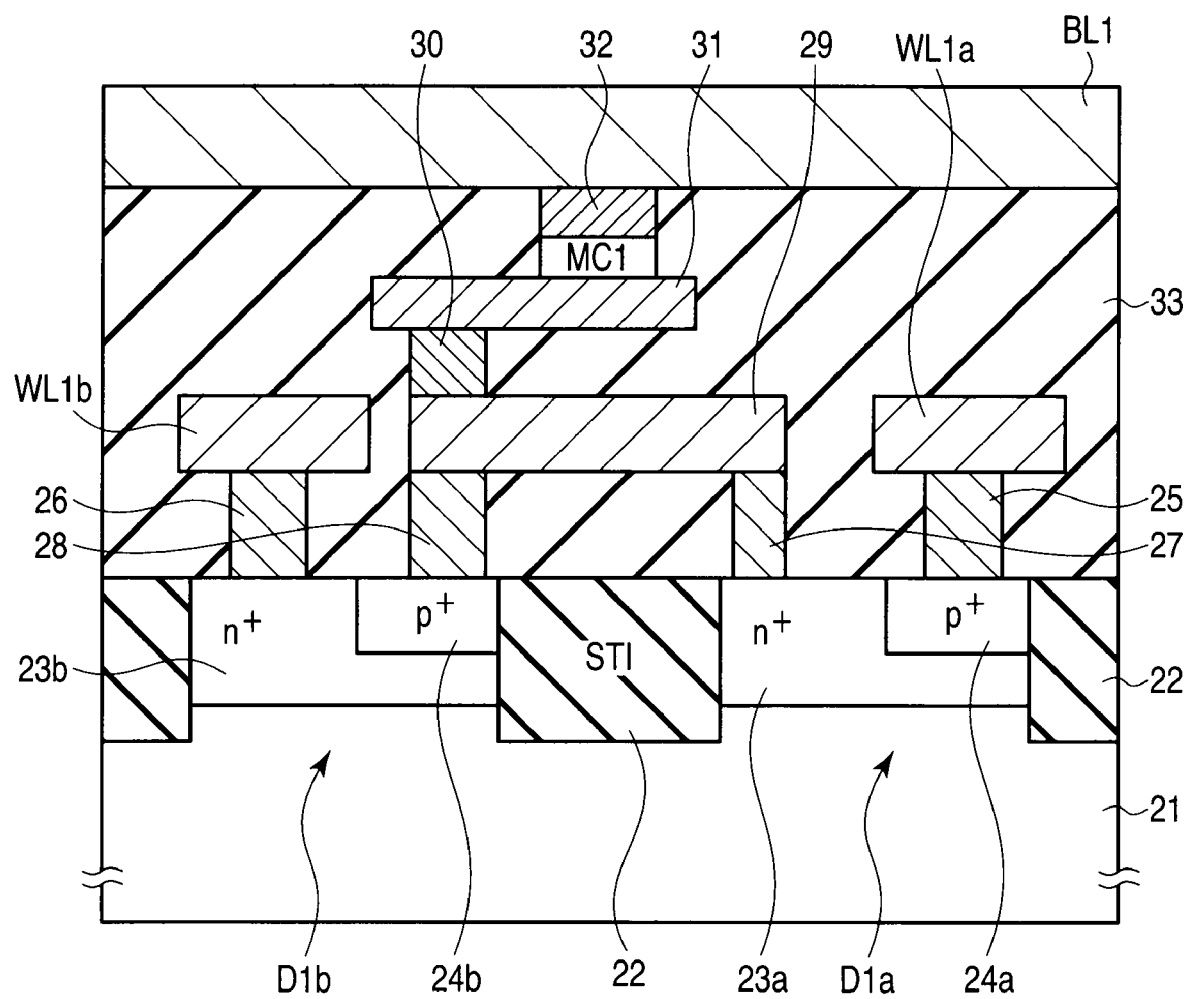
F I G. 20

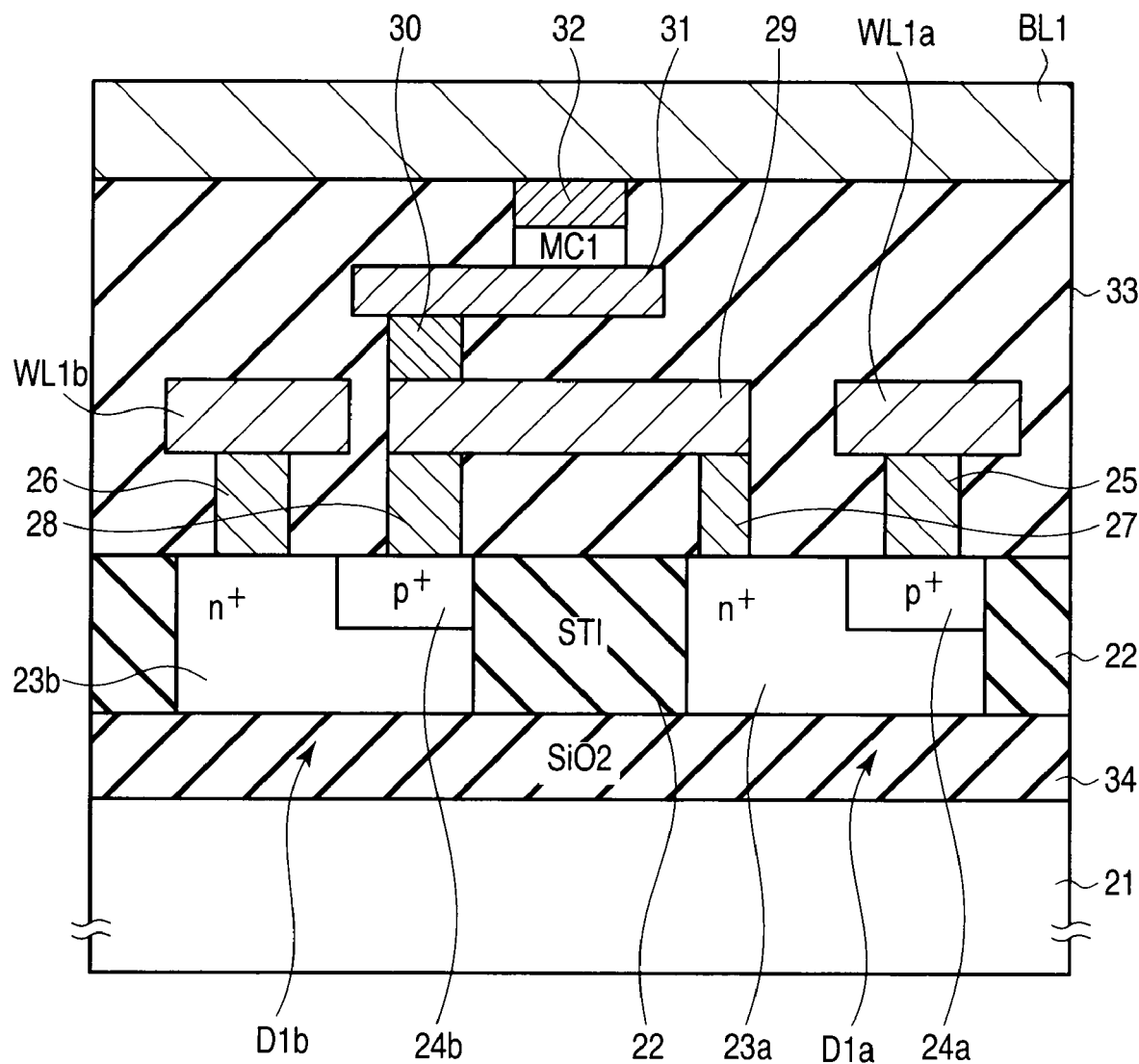
F I G. 21
Second direction

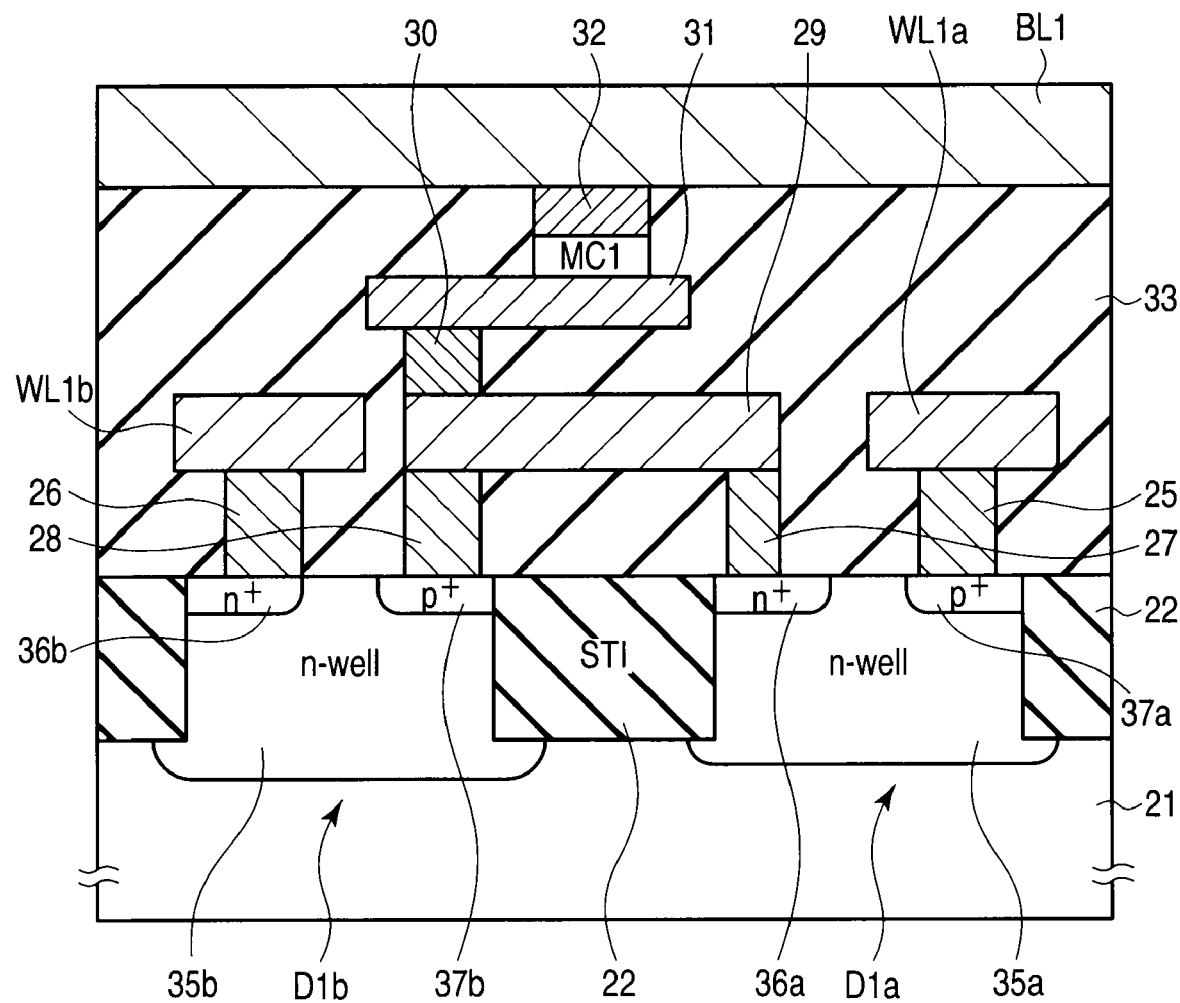
F I G. 22
Second direction

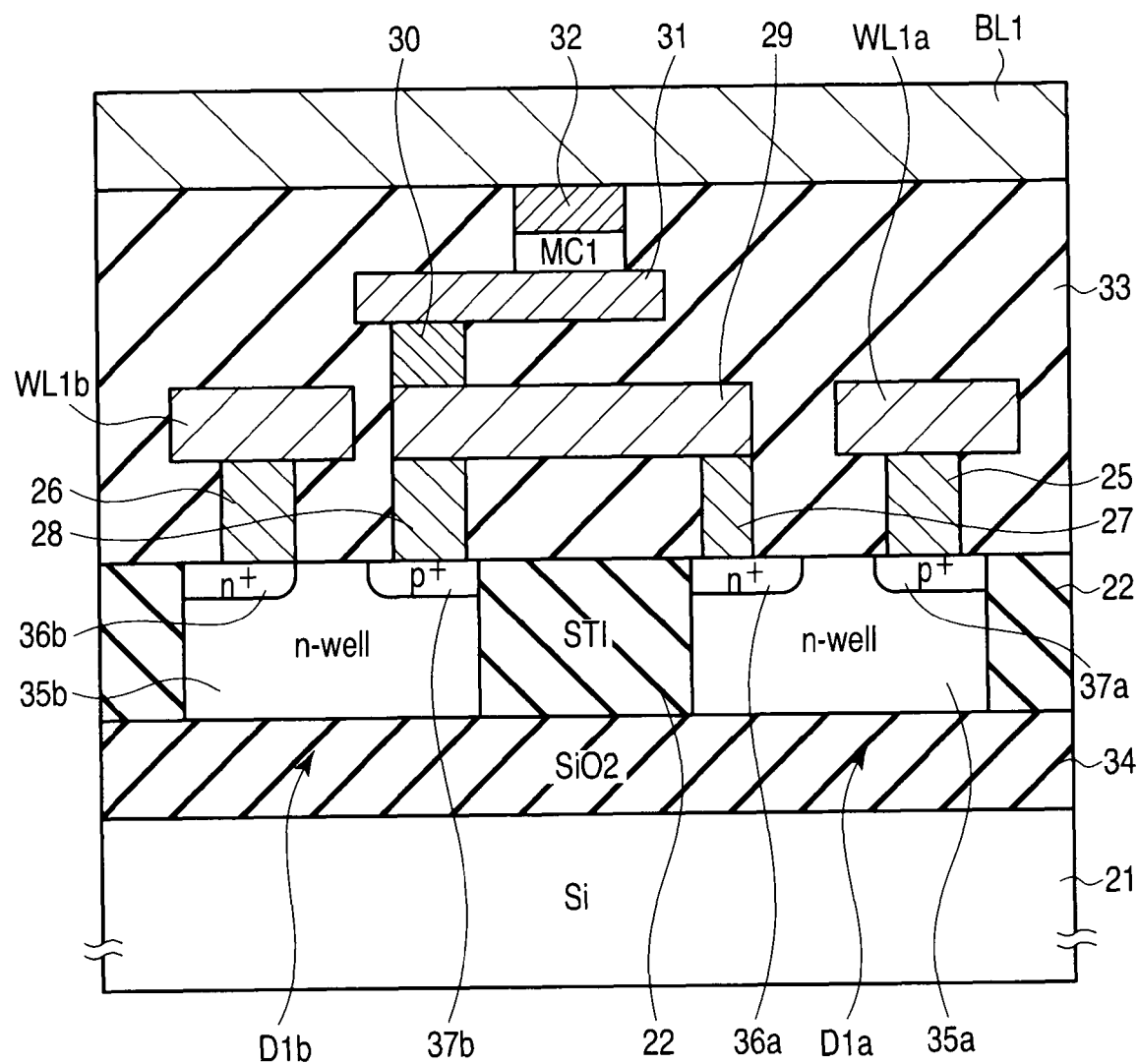
F I G. 23

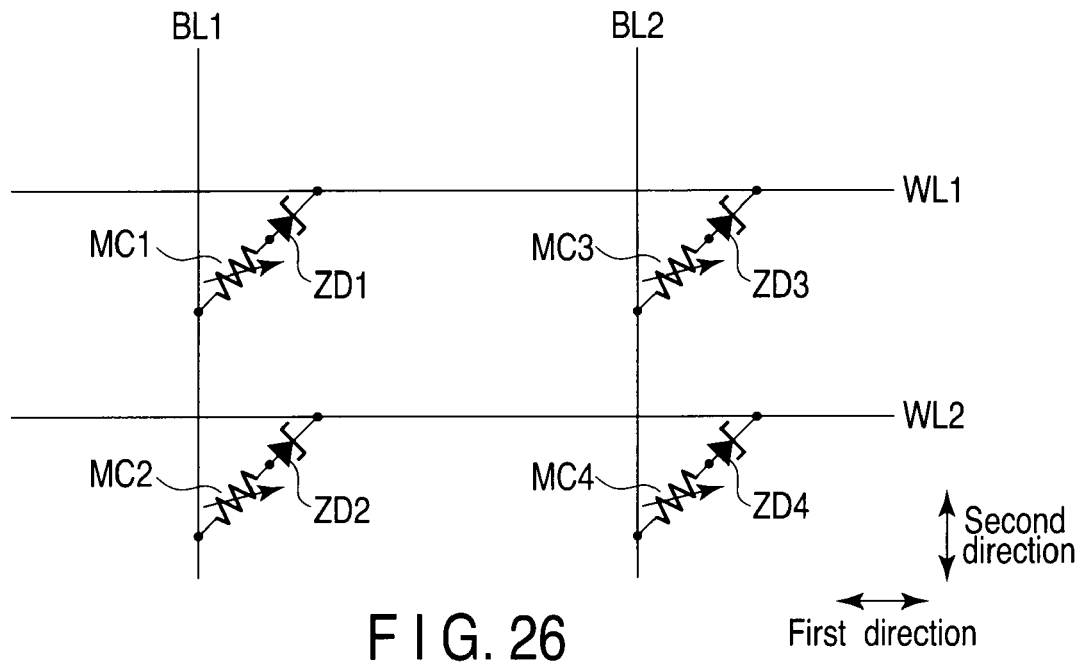
F I G. 26
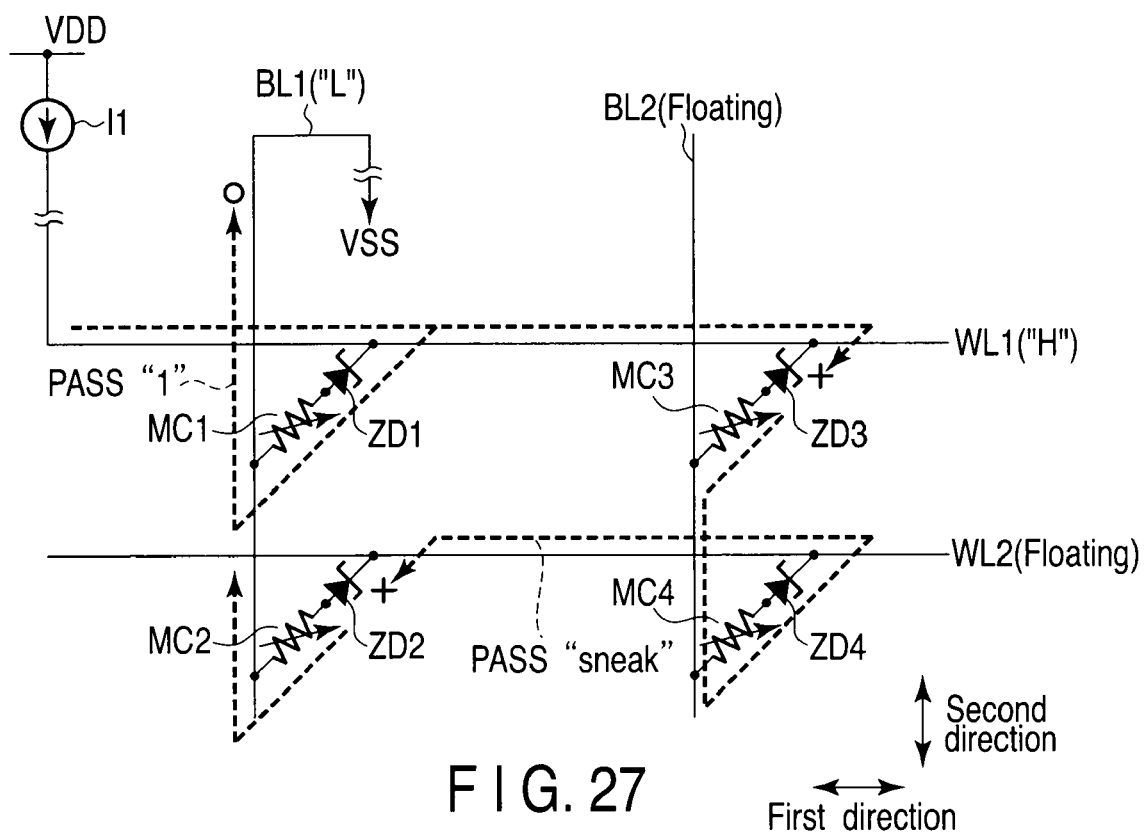
F I G. 27

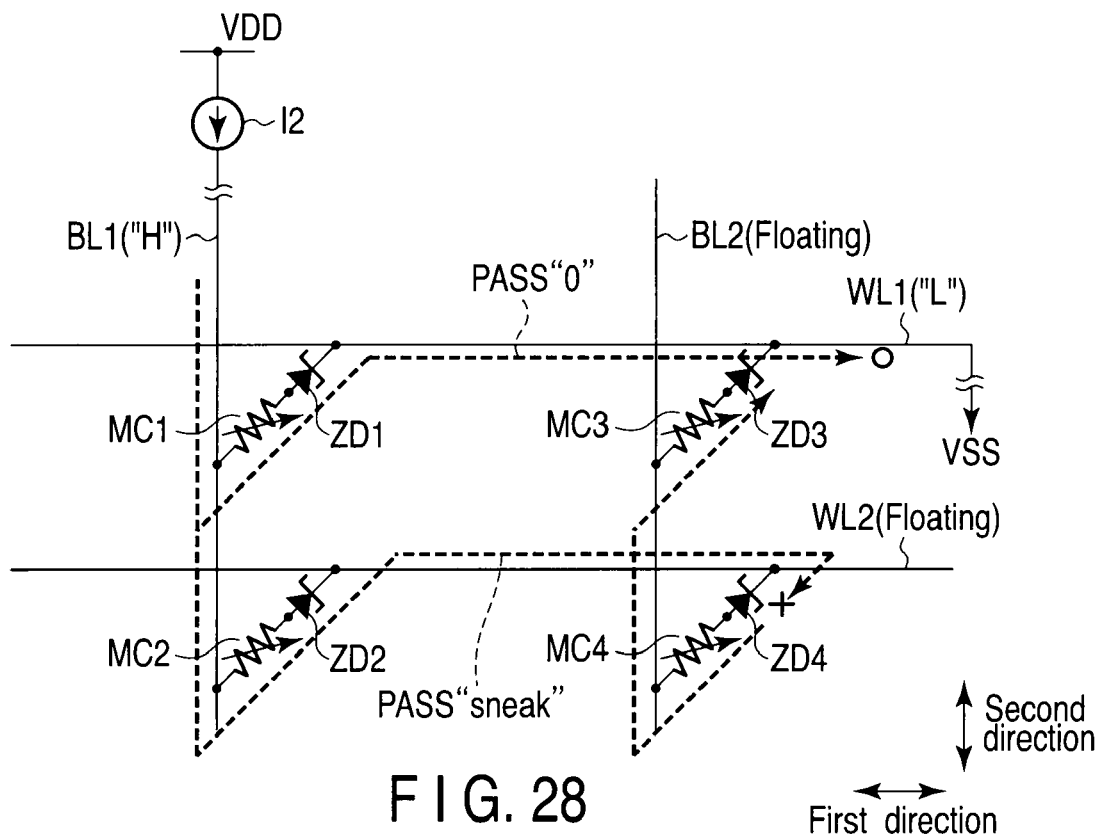
F I G. 28
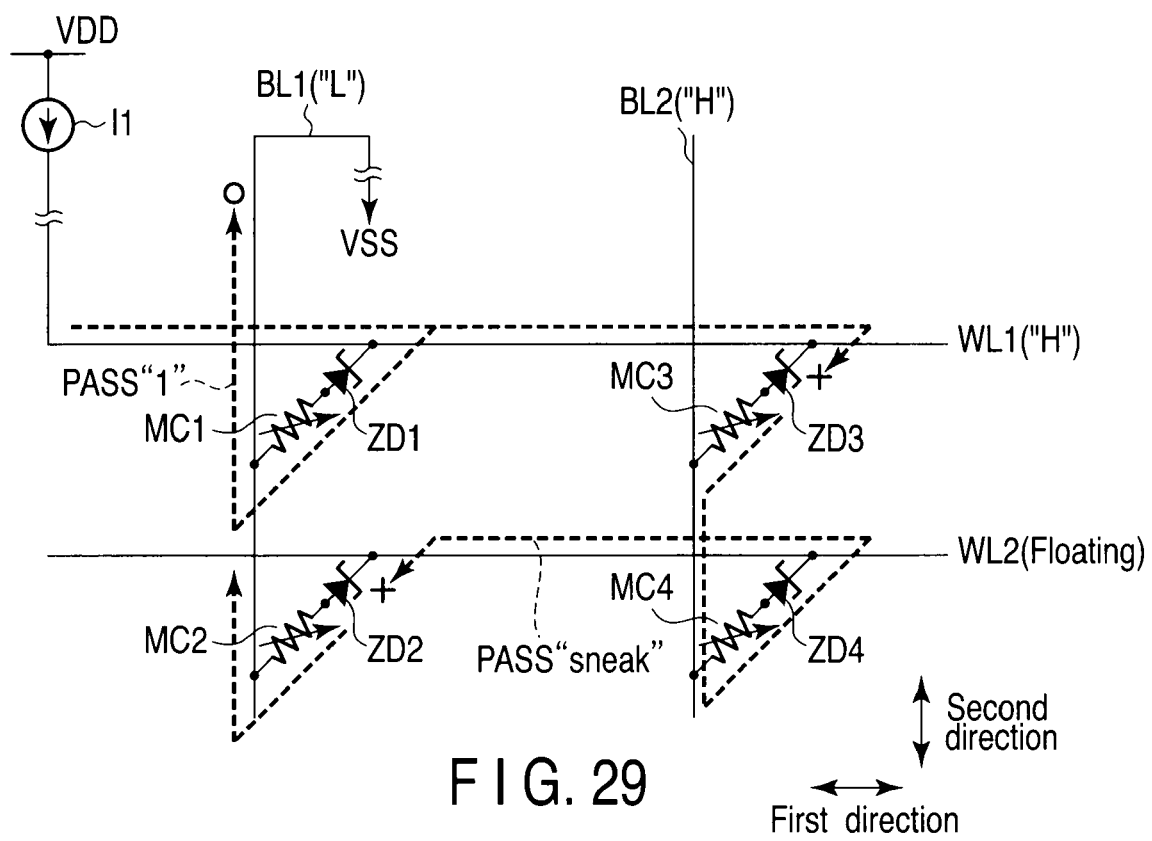
F I G. 29

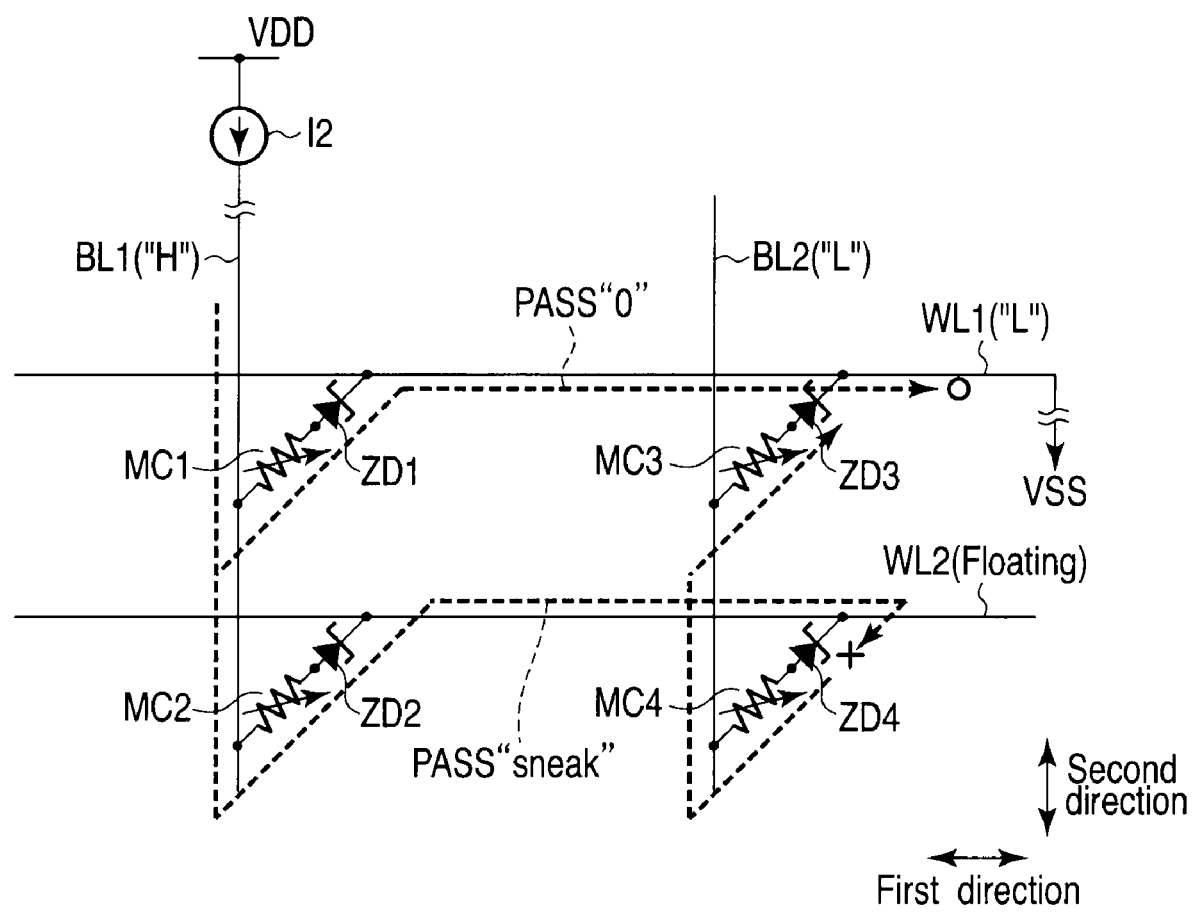
F I G. 30

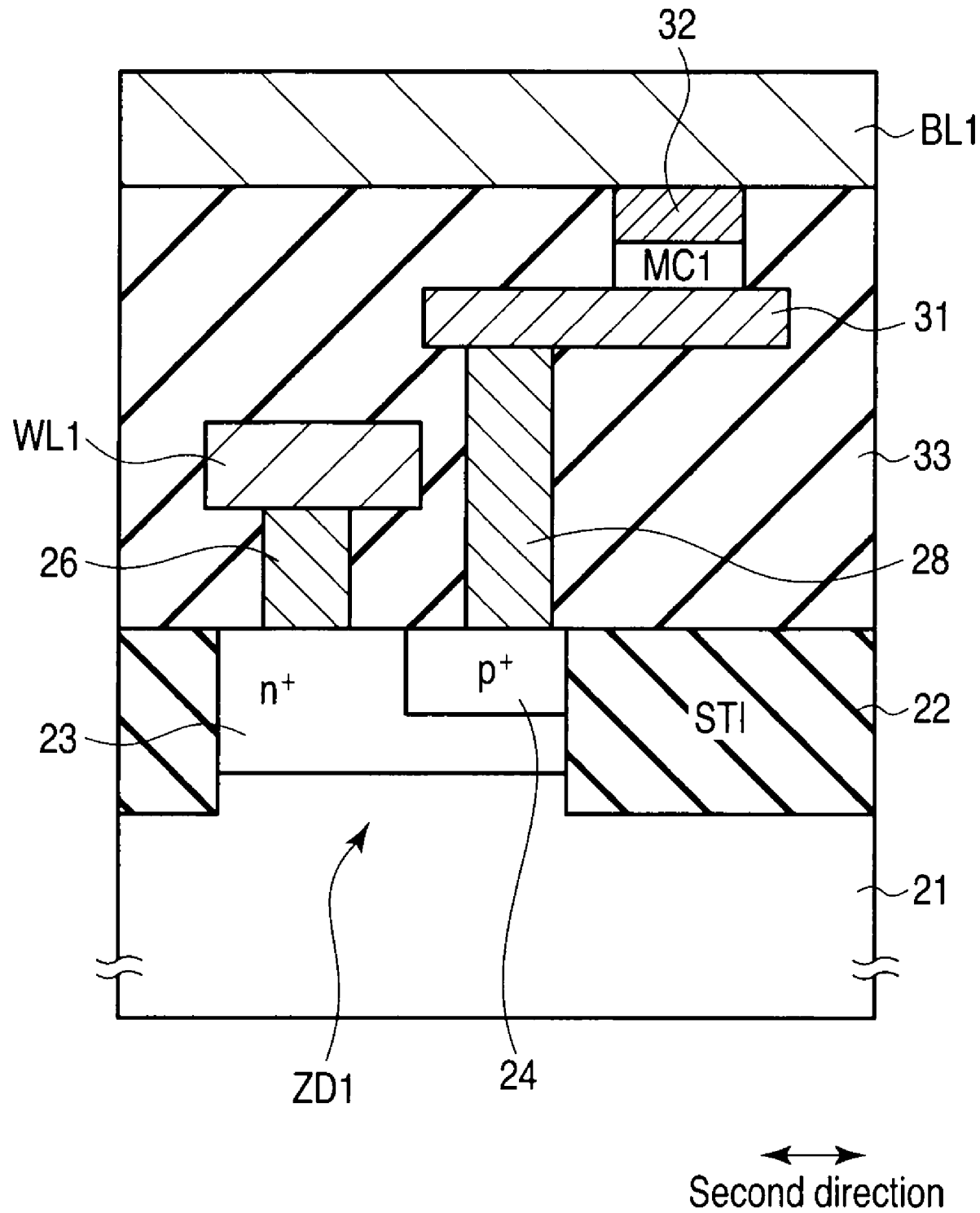
F I G. 31

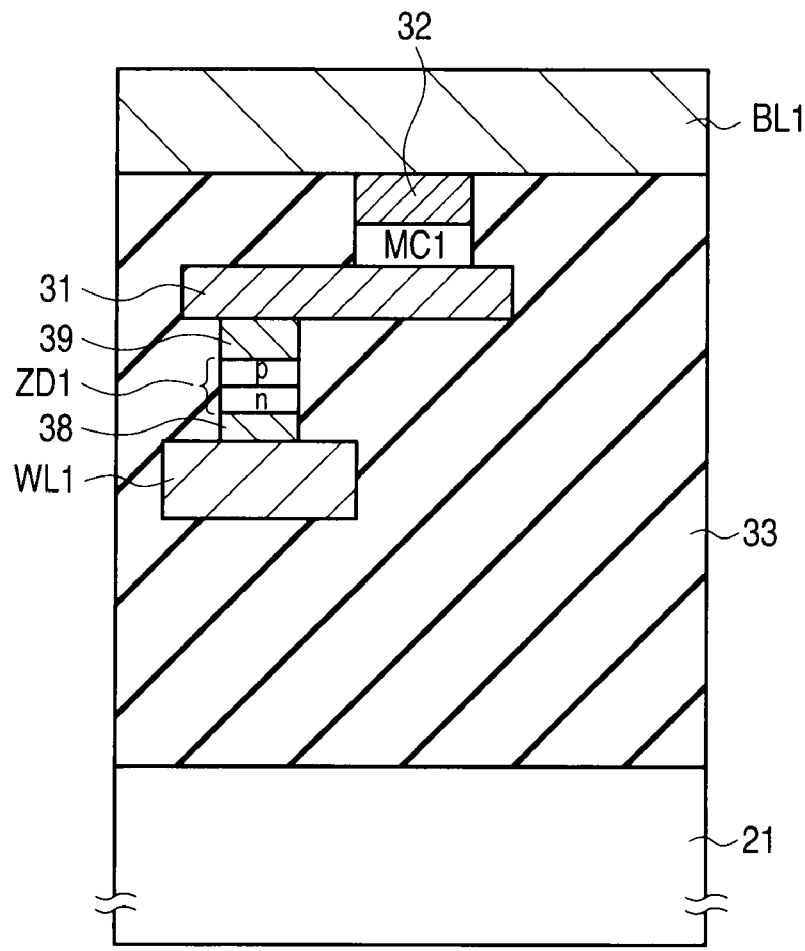
F I G. 32    Second direction
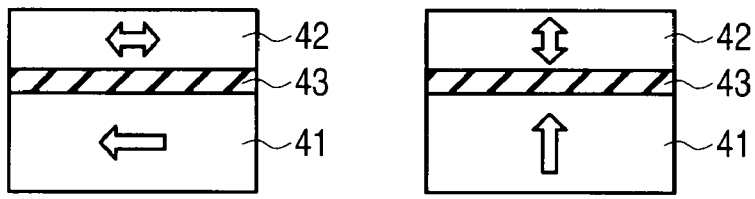
F I G. 33

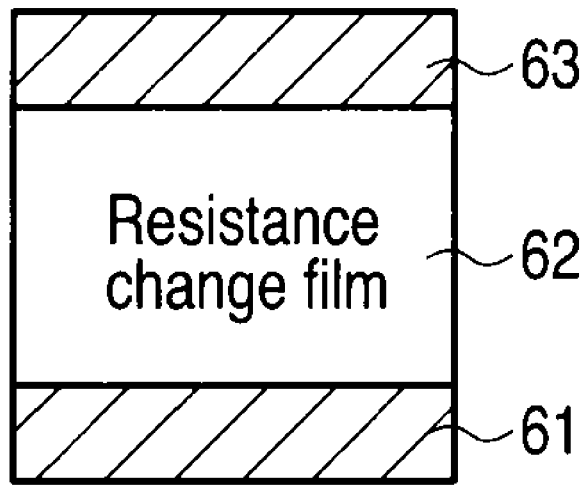
F I G. 34

RESISTANCE CHANGE TYPE MEMORY

CROSS-REFERENCE TO RELATED APPLICATIONS

This application is based upon and claims the benefit of priority from prior Japanese Patent Application No. 2008-004452, filed Jan. 11, 2008, the entire contents of which are incorporated herein by reference.

BACKGROUND OF THE INVENTION

1. Field of the Invention

The present invention relates to a resistance change type memory.

2. Description of the Related Art

Attention has been paid to a resistance change type memory such as MRAM (Magnetic Random Access Memory), ReRAM (Resistive Random Access Memory), and the like as a next generation non-volatile memory succeeding to a NAND type flash memory (refer to, for example, U.S. Pat. No. 6,256,223).

Data is written to the resistance change type memory by causing a write current to flow to, for example, a resistance change element as a memory cell and changing its state (resistance value). Further, data is read by causing a read current to flow to the resistance change element and detecting its resistance value. The value of the read current is set smaller than that of the write current.

There is disturb and retention as elements for evaluating the performance of a non-volatile memory.

The disturb means disturbance (erroneous writing) caused to a memory cell when data is read and written, the retention means a data-retention period of the memory cell.

Incidentally, when a memory cell is miniaturized, since a wiring resistance and the turned-on resistance of a transistor are increased, when a drive voltage has a predetermined value, the value of a write current, which can be caused to flow to the memory cell, is reduced.

However, the value of the write current affects the retention. That is, when the value of the write current is reduced, the data-retention period of a memory cell is generally shortened.

Further, a voltage applied to a memory cell when data is read affects reading sensitivity. Thus, to maintain sufficient reading sensitivity, the voltage applied to the memory cell when data is read, i.e., the value of a read current cannot be sufficiently reduced.

In this case, when the value of the write current is reduced as described above, since the voltage applied to the memory cell when data is written is reduced, the ratio between the voltage applied to the memory cell when data is read and the voltage applied to the memory cell when data is written is reduced.

Accordingly, when the value of the write current is reduced, read disturb is liable to occur.

BRIEF SUMMARY OF THE INVENTION

A resistance change type memory according to an aspect of the present invention comprises first and second drive lines extending in a first direction, a third drive line extending in a second direction intersecting the first direction, a first resistance change element having one end connected to the third drive line, a first diode having an anode connected to the first drive line and a cathode connected to other end of the first resistance change element, a second diode having an anode connected to other end of the first resistance change element and a cathode connected to the second drive line, a driver/sinker which supplies a write current to the first resistance change element, and a write control circuit arranged such that when first data is written to the first resistance change element, the write current is caused to flow in a direction from the first drive line to the third drive line, and when second data is written to the first resistance change element, the write current is caused to flow in a direction from the third drive line to the second drive line.

A resistance change type memory according to an aspect of the present invention comprises first and second drive lines extending in a first direction, third and fourth drive lines extending in a second direction intersecting the first direction, first and second resistance change elements having one ends connected to the third drive line, third and fourth resistance change elements having one ends connected to the fourth drive line, a first zener diode having an anode connected to other end of the first resistance change element and a cathode connected to the first drive line, a second zener diode having an anode connected to other end of the second resistance change element and a cathode connected to the second drive line, a third zener diode having an anode connected to other end of the third resistance change element and a cathode connected to the first drive line, a fourth zener diode having an anode connected to other end of the fourth resistance change element and a cathode connected to the second drive line, a driver/sinker which supplies a write current to the first resistance change element, and a write control circuit arranged such that when first data is written to the first resistance change element, the write current is caused to flow in a direction from the first drive line to the third drive line, and when second data is written to the first resistance change element, the write current is caused to flow in a direction from the third drive line to the first drive line. When the first and second data are written to the first resistance change element, the write control circuit causes the second drive line to float. The write current is set to such a value that a voltage applied to the first zener diode is made equal to or larger than the zener voltage thereof and a voltage applied to the third zener diode is made less than the zener voltage thereof when the first data is written to the first resistance change element, and that a voltage applied to the fourth zener diode is made less than the zener voltage thereof when the second data is written to the first resistance change element.

BRIEF DESCRIPTION OF THE SEVERAL VIEWS OF THE DRAWING

FIG. 1 is a view showing a first basic architecture of the present invention;

FIG. 2 is a view showing a second basic architecture of the present invention;

FIG. 3 is a view showing a third basic architecture of the present invention;

FIG. 4 is a view showing a fourth basic architecture of the present invention;

FIG. 5 is a view showing a fifth basic architecture of the present invention;

FIG. 6 is a view showing a sixth basic architecture of the present invention;

FIG. 7 is a view showing a seventh basic architecture of the present invention;

FIG. 8 is a view showing an eighth basic architecture of the present invention;

FIG. 13 is a view showing the write control circuit;
FIG. 14 is a view showing a decoder;
FIG. 15 is a view showing a memory cell array in detail;
FIG. 17 is a view showing a current path when "0" is written;
FIG. 18 is a view showing a current path when "1" is written;
FIG. 19 is a view showing a current path when "0" is written;
FIG. 20 is a view showing a first example of a device structure;
FIG. 21 is a view showing a second example of the device structure;
FIG. 22 is a view showing a third example of the device structure;
FIG. 23 is a view showing a fourth example of the device structure;
FIG. 26 is a view showing a memory cell array in detail;
FIG. 27 is a view showing a current path when "1" is written;
FIG. 28 is a view showing a current path when "0" is written;
FIG. 29 is view showing a current path when "1" is written;
FIG. 30 is a view showing a current path when "0" is written;
FIG. 31 is a view showing a first example of a device structure;
FIG. 32 is a view showing a second example of the device structure;
FIG. 33 is a view showing a basic structure of a magneto-resistive effect element;
and
FIG. 34 is a view showing a basic structure of a resistance change element.

DETAILED DESCRIPTION OF THE INVENTION

Figure 9:
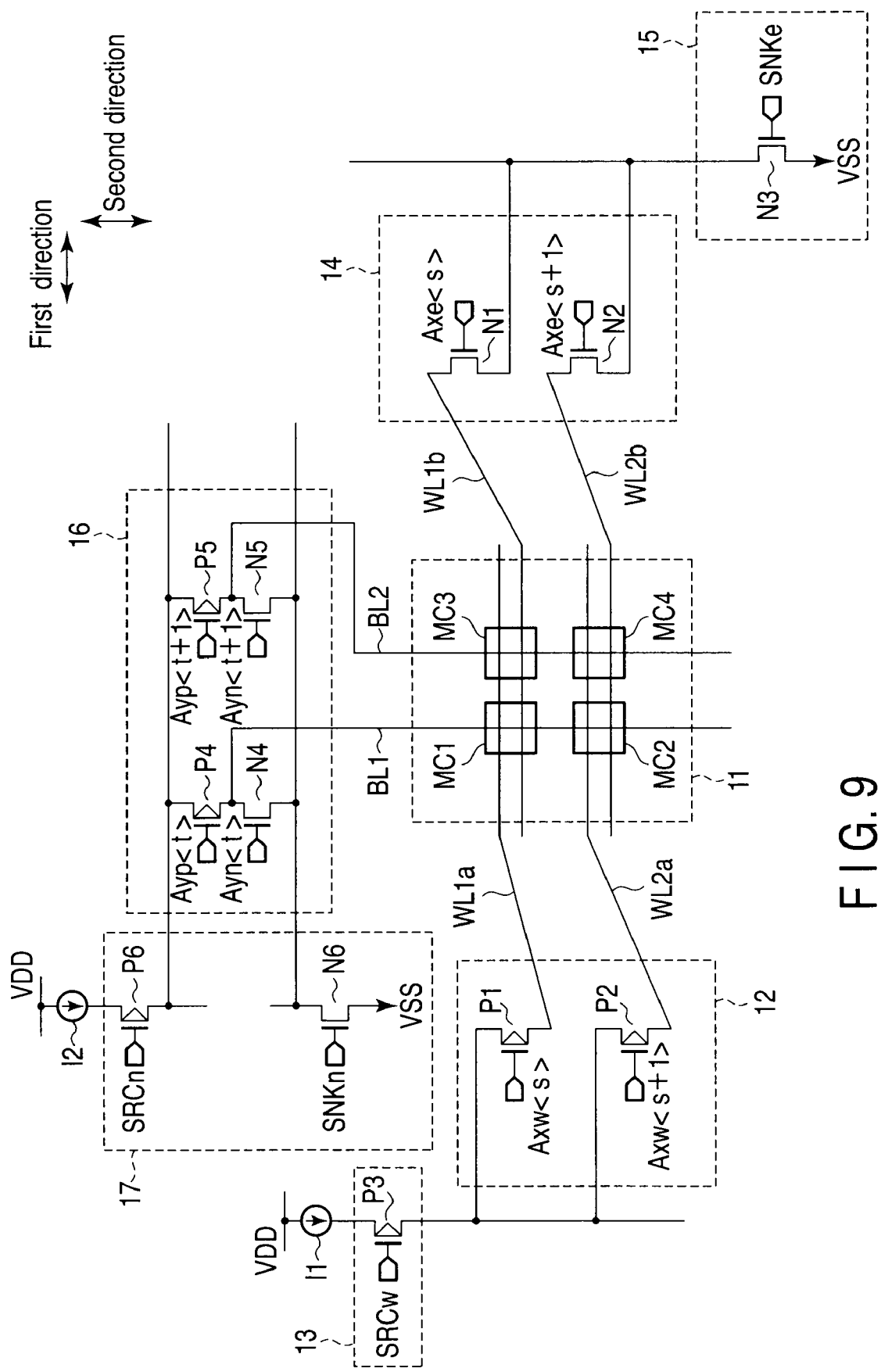
FIG. 9 is a view showing a resistance change type memory of a first embodiment.

A resistance change type memory of an aspect of the present invention will be described below in detail with reference to the accompanying drawing.

1. Outline

The present invention proposes the following two cell array structures as a modified structure of a cross point type cell array.

(1) First Cell Array Structure (First to Sixth Basic Architectures)

Two diodes, which are disposed in an opposite direction from each other, are connected to one resistance change element.

When first data is written to the resistance change element, a write current is caused to flow to one of the two diodes in a forward direction, and when second data is written thereto, the write current is caused to flow to the other of two diodes in the forward direction.

(2) Second Cell Array Structure (Seventh and Eighth Basic Architectures)

A resistance change element and a zener diode, which are connected to each other in series, are arranged in an intersecting portion of each of a plurality of drive lines intersecting with each other.

A write current is caused to flow to satisfy the following condition.

A voltage applied to a zener diode connected to a selected resistance change element is made equal to or larger than the zener voltage thereof as well as a voltage applied to a zener diode connected to a non-selected resistance change element is made less than the zener voltage thereof.

Since these two cell array structures can prevent a sneak current specific to a cross point type cell array, write disturb can be suppressed when the write current is increased.

Therefore, according to the present invention, disturb and retention can be improved at the same time by increasing the write current.

2. Basic Architecture

A basic architecture of the present invention will be explained.

(1) First Basic Architecture

FIG. 1 shows a first basic architecture of a resistance change type memory of the present invention.

First and second drive lines L1, L2 extend in a first direction, and a third drive line L3 extends in a second direction intersecting the first direction. The first and second directions are directions, for example, orthogonal to each other.

The third drive line L3 is one of a bit line and a word line.

When the third drive line L3 is the bit line, the first and second drive lines L1, L2 are the word lines, respectively. Further, when the third drive line L3 is the word line, the first and second drive lines L1, L2 are the bit lines, respectively.

One end of a resistance change element MC is connected to the third drive line L3.

The resistance change element MC includes a magneto-resistive element made by spin-injection writing, a phase-change element for controlling write data by a current direction, and the like.

An anode of a first diode D1 is connected to the first drive line L1, and a cathode thereof is connected to the other end of the resistance change element MC. An anode of a second diode D2 is connected to the other end of the resistance change element MC, and the cathode thereof is connected to the second drive line L2.

A driver/sinker DS is connected to the first and second drive lines L1, L2, respectively, and the driver/sinker DS is connected to the third drive line L3 likewise. These elements supply the write current to the resistance change element MC when data is written.

When the first data is written to the resistance change element MC, a write control circuit CNT causes the write current to flow in a direction from the first drive line L1 to the third drive line L3, and when the second data is written to the resistance change element MC, the write control circuit CNT causes the write current to flow in a direction from the third drive line L3 to the second drive line L2.

When binary data is stored to the resistance change element MC, the first data is, for example, "1" and the second data is, for example, "0". However, multi-level data such as ternary data or more may be stored to the resistance change element MC.

(2) Second Basic Architecture

FIG. 2 shows a second basic architecture of the resistance change type memory of the present invention.

The second basic architecture is different from the first basic architecture in that a driver/sinker connected to first and second drive lines L1, L2 has an arrangement different from that of the first basic architecture.

The first and second drive lines L1, L2 extend in a first direction, and a third drive line L3 extends in a second direction intersecting the first direction. The first and second directions are directions, for example, orthogonal to each other.

One end of a resistance change element MC is connected to the third drive line L3.

An anode of a first diode D1 is connected to the first drive line L1, and a cathode thereof is connected to the other end of the resistance change element MC. An anode of a second diode D2 is connected to the other end of the resistance change element MC, and the cathode thereof is connected to the second drive line L2.

A driver DRV is connected to the first drive line L1, and a sinker SK is connected to the second drive line L2. Further, the driver/sinker DS is connected to the third drive line L3. These elements supply a write current to the resistance change element MC when data is written.

When the first data is written to the resistance change element MC, a write control circuit CNT causes the write current to flow in a direction from the first drive line L1 to the third drive line L3, and when the second data is written to the resistance change element MC, the write control circuit CNT causes the write current to flow in a direction from the third drive line L3 to the second drive line L2.

(3) Third Basic Architecture

FIG. 3 shows a third basic architecture of the resistance change type memory of the present invention.

The third basic architecture is also different from the first basic architecture in that a driver/sinker connected to first and second drive lines L1, L2 has an arrangement different from that of the first basic architecture.

The first and second drive lines L1, L2 extend in a first direction, and a third drive line L3 extends in a second direction intersecting the first direction. The first and second directions are directions, for example, orthogonal to each other.

One end of a resistance change element MC is connected to the third drive line L3.

An anode of a first diode D1 is connected to the first drive line L1, and a cathode thereof is connected to the other end of the resistance change element MC. An anode of a second diode D2 is connected to the other end of the resistance change element MC, and the cathode thereof is connected to the second drive line L2.

A driver DRV is connected to one ends of the first and second drive lines L1, L2. A sinker SK is connected to the other ends of the first and second drive lines L1, L2. A driver/sinker DS is connected to the third drive line L3. These elements supply a write current to the resistance change element MC when data is written.

When the first data is written to the resistance change element MC, a write control circuit CNT causes the write current to flow in a direction from the first drive line L1 to the third drive line L3, and when the second data is written to the resistance change element MC, the write control circuit CNT causes the write current to flow in a direction from the third drive line L3 to the second drive line L2.

(4) Fourth Basic Architecture

FIG. 4 shows a fourth basic architecture of the resistance change type memory of the present invention.

The fourth basic architecture is different from the first basic architecture in that a driver/sinker connected to a third drive lines L3 has an arrangement different from that of the first basic architecture.

First and second drive lines L1, L2 extend in a first direction, and the third drive line L3 extends in a second direction intersecting the first direction. The first and second directions are directions, for example, orthogonal to each other.

One end of a resistance change element MC is connected to the third drive line L3.

An anode of a first diode D1 is connected to the first drive line L1, and a cathode thereof is connected to the other end of the resistance change element MC. An anode of a second diode D2 is connected to the other end of the resistance change element MC, and the cathode thereof is connected to the second drive line L2.

The driver/sinker DS is connected to the first and second drive lines L1, L2. A driver DRV is connected to one end of the third drive line L3, and a sinker SK is connected to the other end of the third drive line L3. These elements supply a write current to the resistance change element MC when data is written.

When the first data is written to the resistance change element MC, a write control circuit CNT causes the write current to flow in a direction from the first drive line L1 to the third drive line L3, and when the second data is written to the resistance change element MC, the write control circuit CNT causes the write current to flow in a direction from the third drive line L3 to the second drive line L2.

(5) Fifth Basic Architecture

FIG. 5 shows a fifth basic architecture of the resistance change type memory of the present invention.

The fifth basic architecture is different from the second basic architecture in that a driver/sinker connected to a third drive line L3 has an arrangement different from that of the second basic architecture.

First and second drive lines L1, L2 extend in a first direction, and the third drive line L3 extends in a second direction intersecting the first direction. The first and second directions are directions, for example, orthogonal to each other.

One end of a resistance change element MC is connected to the third drive line L3.

An anode of a first diode D1 is connected to the first drive line L1, and a cathode thereof is connected to the other end of the resistance change element MC. An anode of a second diode D2 is connected to the other end of the resistance change element MC, and the cathode thereof is connected to the second drive line L2.

A driver DRV is connected to the first drive line L1, and a sinker SK is connected to the second drive line L2. Further, the driver DRV is connected to one end of the third drive line L3, and the sinker SK is connected to the other end of the third drive line L3. These elements supply a write current to the resistance change element MC when data is written.

When the first data is written to the resistance change element MC, a write control circuit CNT causes the write current to flow in a direction from the first drive line L1 to the third drive line L3, and when the second data is written to the resistance change element MC, the write control circuit CNT causes the write current to flow in a direction from the third drive line L3 to the second drive line L2.

(6) Sixth Basic Architecture

FIG. 6 shows a sixth basic architecture of the resistance change type memory of the present invention.

The sixth basic architecture is different from the third basic architecture in that a driver/sinker connected to a third drive line L3 has an arrangement different from that of the third basic architecture.

First and second drive lines L1, L2 extend in a first direction, and the third drive line L3 extends in a second direction intersecting the first direction. The first and second directions are directions, for example, orthogonal to each other.

One end of a resistance change element MC is connected to the third drive line L3.

An anode of a first diode D1 is connected to the first drive line L1, and a cathode thereof is connected to the other end of the resistance change element MC. An anode of a second diode D2 is connected to the other end of the resistance change element MC, and the cathode thereof is connected to the second drive line L2.

A driver DRV is connected to one ends of the first and second drive lines L1, L2. A sinker SK is connected to the other ends of the first and second drive lines L1, L2. Further, the driver DRV is connected to one end of the third drive line L3, and the sinker SK is connected to the other end of the third drive line L3. These elements supply a write current to the resistance change element MC when data is written.

When the first data is written to the resistance change element MC, a write control circuit CNT causes the write current to flow in a direction from the first drive line L1 to the third drive line L3, and when the second data is written to the resistance change element MC, the write control circuit CNT causes the write current to flow in a direction from the third drive line L3 to the second drive line L2.

(7) Seventh Basic Architecture

FIG. 7 shows a seventh basic architecture of the resistance change type memory of the present invention.

The seventh basic architecture relates to a writing technology making use of bidirectional energization executed by a zener diode.

First and second drive lines L1, L2 extend in a first direction, and a third and fourth drive lines L3, L4 extend in a second direction intersecting the first direction. The first and second directions are directions, for example, orthogonal to each other.

When the first and second drive lines L1, L2 are word lines, the third drive line L3 and a fourth drive line L4 are bit lines. Further, when the first and second drive lines L1, L2 are the bit lines, the third and fourth drive lines L3, L4 are word lines.

One ends of first and second resistance change elements MC1, MC2 are connected to the third drive line L3, and one ends of the third and fourth resistance change elements MC3, MC4 are connected to the fourth drive line L4.

An anode of a first zener diode ZD1 is connected to the other end of the first resistance change element MC1 and a cathode thereof is connected to the first drive line L1, and an anode of a second zener diode ZD2 is connected to the other end of the second resistance change element MC2 and a cathode thereof is connected to the second drive line L2.

An anode of a third zener diode ZD3 is connected to the other end of the third resistance change element MC3 and a cathode thereof is connected to the first drive line L1, and an anode of a fourth zener diode ZD4 is connected to the other end of the fourth resistance change element MC4 and a cathode thereof is connected to the second drive line L2.

The resistance change elements MC1 to MC4 include magneto-resistive elements, phase-change elements, and the like.

A driver/sinker DS is connected to the first and second drive lines L1, L2, respectively, and the driver/sinker DS is connected to the third and fourth drive lines L3, L4, respectively, likewise. These elements supply a write current to the resistance change element MC1 when data is written.

When the first data is written to the resistance change element MC1, a write control circuit CNT causes the write current to flow in a direction from the first drive line L1 to the third drive line L3, and when the second data is written to the resistance change element MC1, the write control circuit CNT causes the write current to flow in a direction from the third drive line L3 to the first drive line L1.

A write current is set to such values that when the first data is written to the resistance change element MC1, a voltage applied to the first zener diode ZD1 is made equal to or more than the zener voltage thereof and a voltage applied to the second and third zener diodes ZD2, ZD3 is made less than the zener voltage as well as when the second data is written to the resistance change element MC1, a voltage applied to the fourth zener diode ZD4 is made less than the zener voltage.

When binary data is stored to the resistance change element MC1, the first data is, for example, "1" and the second data is, for example, "0". However, multi-level data such as ternary data or more may be stored to the resistance change element MC1.

(8) Eighth Basic Architecture

FIG. 8 shows an eighth basic architecture of the resistance change type memory of the present invention.

The eighth basic architecture is different from the seventh basic architecture in that a driver/sinker connected to first to fourth drive lines L1 to L4 has an arrangement different from that of the seventh basic architecture.

The first and second drive lines L1, L2 extend in a first direction, and the third and fourth drive lines L3, L4 extend in a second direction intersecting the first direction. The first and second directions are directions, for example, orthogonal to each other.

One ends of first and second resistance change elements MC1, MC2 are connected to the third drive line L3, and one ends of third and fourth resistance change elements MC3, MC4 are connected to the fourth drive line L4.

An anode of a first zener diode ZD1 is connected to the other end of the first resistance change element MC1 and a cathode thereof is connected to the first drive line L1, and an anode of a second zener diode ZD2 is connected to the other end of the second resistance change element MC2 and a cathode thereof is connected to the second drive line L2.

An anode of a third zener diode ZD3 is connected to the other end of the third resistance change element MC3 and a cathode thereof is connected to the first drive line L1, and an anode of a fourth zener diode ZD4 is connected to the other end of the fourth resistance change element MC4 and a cathode thereof is connected to the second drive line L2.

A driver DRV is connected to one ends of the first and second drive lines L1, L2, and a sinker SK is connected to the other ends of the first and second drive lines L1, L2. Further, the driver/sinker DS is connected to one ends of the third and fourth drive lines L3, L4. These elements supply a write current to the resistance change element MC1 when data is written.

When the first data is written to the resistance change element MC1, a write control circuit CNT causes the write current to flow in a direction from the first drive line L1 to the third drive line L3, and when the second data is written to the resistance change element MC1, the write control circuit CNT causes the write current to flow in a direction from the third drive line L3 to the first drive line L1.

A write current is set to such values that when the first data is written to the resistance change element MC1, a voltage applied to the first zener diode ZD1 is made equal to or more than the zener voltage thereof and a voltage applied to the second and third zener diodes ZD2, ZD3 is made less than the zener voltage thereof as well as when the second data is written to the resistance change element MC1, a voltage applied to the fourth zener diode ZD4 is made less than the zener voltage thereof.

(9) Conclusion

According to the first to eighth basic architectures, since a sneak current is prevented, an erroneous writing due to write disturb can be avoided.

Further, according to these basic architectures, since a sneak current caused when data is read is prevented at the same time, sensitivity is also improved when data is read.

3. Embodiments

Embodiments of the present invention will be explained.

In the explanation described below, a portion as to a read circuit is omitted so that a write circuit according to the present invention can be easily understood.

(1) First Embodiment

A. Circuit Arrangement (First Example)

The circuit shows a specific arrangement of the second basic architecture (FIG. 2).

Figure 10:
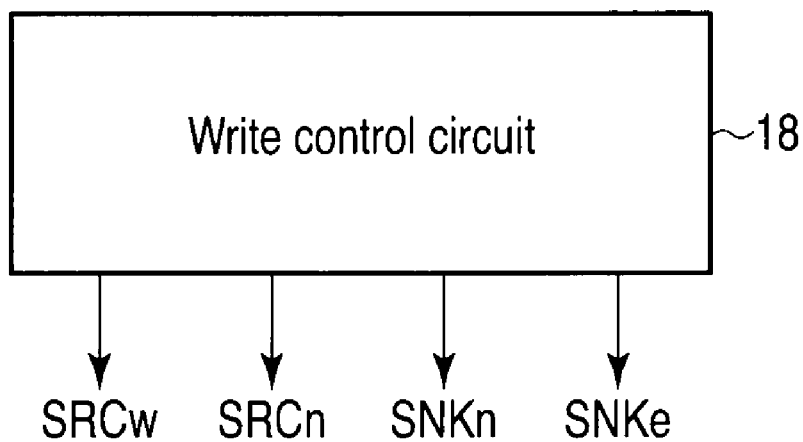
FIG. 10 is a view showing a write control circuit.
Figure 11:
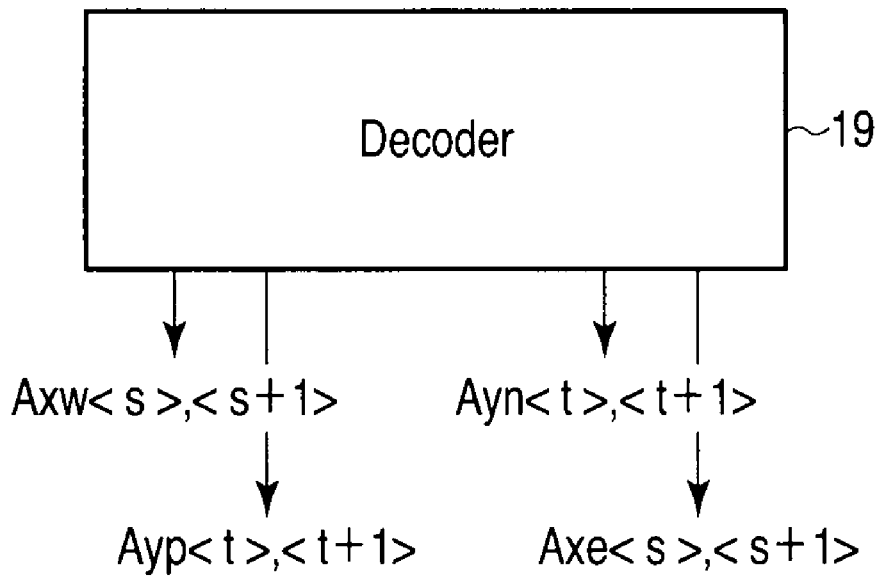
FIG. 11 is a view showing a decoder.

FIGS. 9 to 11 show a write circuit of the resistance change type memory of the present invention.

A memory cell array 11 is composed of a plurality of memory cells. Four memory cells MC1, MC2, MC3, MC4 are shown here for simplification.

The memory cells MC1, MC2, MC3, MC4 are resistance change elements.

Word lines WL1a, WL1b, WL2a, WL2b, which extend in a first direction, are disposed on the memory cell array 11. The word lines WL1a, WL1b constitute a word line pair and are disposed in correspondence to the memory cells MC1, MC3. Likewise, the word lines WL2a, WL2b constitute a word line pair and are disposed in correspondence to the memory cells MC2, MC4.

One ends of the word lines WL1a, WL2a are connected to a word line driver 13 through a word line selector 12. One ends of the word lines WL1b, WL2b are placed in, for example, an open state (to which nothing is connected).

The word line selector 12 is composed of P channel MOS transistors P1, P2 having gates to which control signals Axw<s>, Axw<s+1> are input. The word line driver 13 is composed of a P channel MOS transistor P3 having a gate to which a control signal SRCw is input.

A current source I1 generates a write current.

Further, the other ends of the word lines WL1b, WL2b are connected to a word line sinker 15 through a word line selector 14. The other ends of the word lines WL1a, WL2a are placed in, for example, an open state.

The word line selector 14 is composed of N channel MOS transistors N1, N2 having gates to which control signals Axe<s>, Axe<s+1> are input. The word line sinker 15 is composed of an N channel MOS transistor N3 having a gate to which a control signal SNKe is input.

Further, bit lines BL1, BL2, which extend in a second direction intersecting the first direction, are disposed on the memory cell array 11. The bit line BL1 is disposed in correspondence to the memory cells MC1, MC2, and the bit line BL2 is disposed in correspondence to the memory cells MC3, MC4.

One ends of the bit lines BL1, BL2 are connected to a bit line driver/sinker 17 through a bit line selector 16. The other ends of the bit lines BL1, BL2 are placed in, for example, an open state.

The bit line selector 16 is composed of P channel MOS transistors P4, P5 having gates to which control signals Ayp<t>, Ayp<t+1> are input and N channel MOS transistors N4, N5 having gates to which control signals Ayn<t>, Ayn<t+1> are input.

The word line driver/sinker 17 is composed of a P channel MOS transistor P6 having a gate to which a control signal SRCn is input and an N channel MOS transistor N6 having a gate to which a control signal SNKn is input.

A current source I2 generates a write current.

A write control circuit 18 of FIG. 10 generates control signals SRCw, SRCn, SNKn, SNKe. Further, a decoder 19 of FIG. 11 generates control signals (decode signal) Axw<s>, <s+1>; Ayp<t>,<t+1>; Ayn<t>,<t+1>; Axe<s>,<s+1>.

B. Circuit Arrangement (Second Example)

The circuit shows a specific arrangement of the third basic architecture (FIG. 3).

Figure 12:
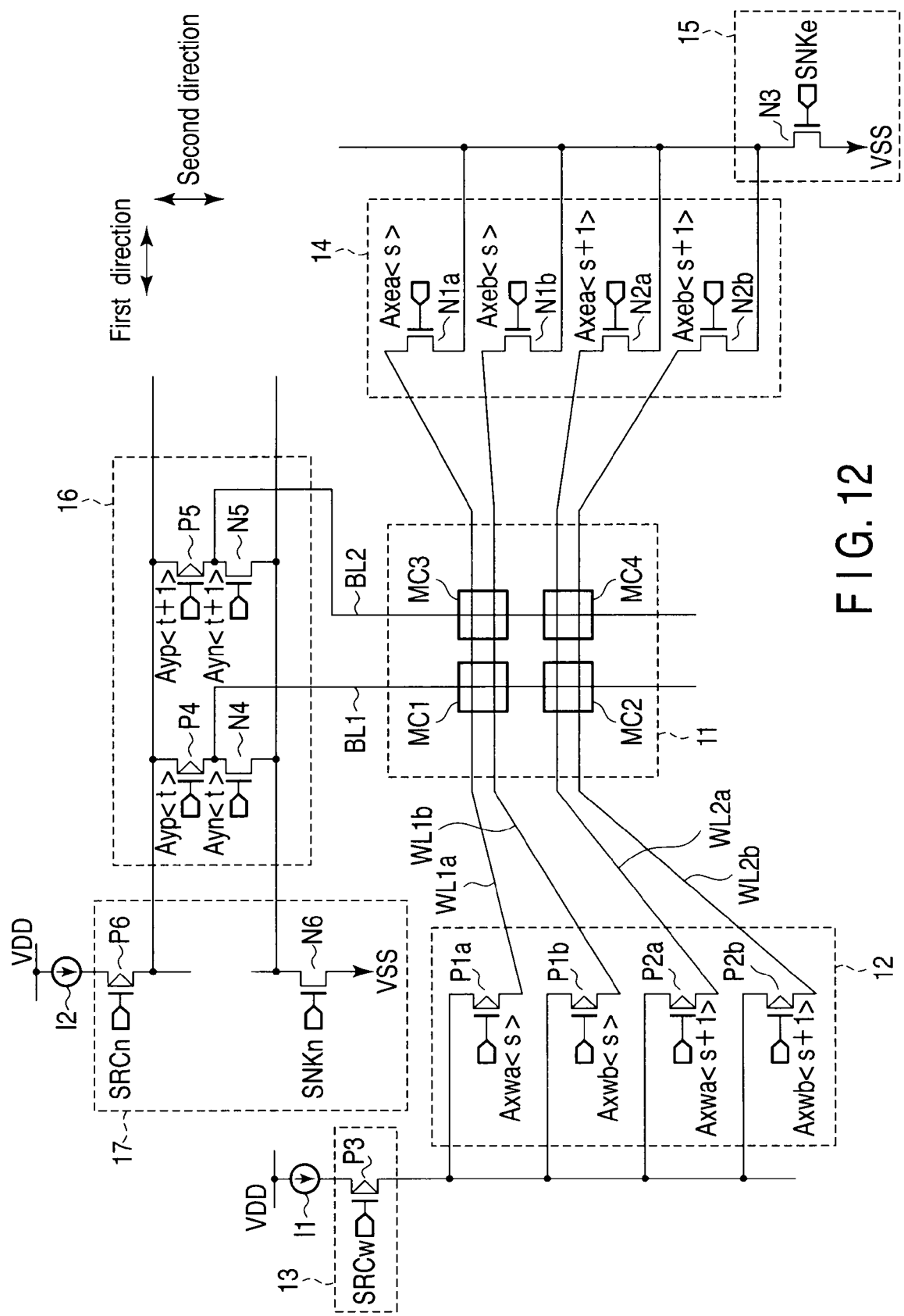
FIG. 12 is a view showing a resistance change type memory of the first embodiment.

FIGS. 12 to 14 show a write circuit of the resistance change type memory of the present invention.

A second example has a feature in word line selectors 12, 14 as compared with the first example. Since the arrangement other than the word line selectors 12, 14 is the same as the first example, only the word line selectors 12, 14 will be explained below.

One ends of word lines WL1a, WL2a, WL1b, WL2b are connected to a word line driver 13 through the word line selector 12.

The word line selector 12 is composed of P channel MOS transistors P1a, P1b, P2a, P2b having gates to which control signals Axwa<s>, Axwb<s>, Axwa<s+1>, Axwb<s+1> are input.

Further, the other ends of the word lines WL1a, WL2a, WL1b, WL2b are connected to a word line sinker 15 through the word line selector 14.

The word line selector 14 is composed of N channel MOS transistors N1a, N1b, N2a, N2b having gates to which control signals Axea<s>, Axeb<s>, Axea<s+1>, Axeb<s+1> are input.

A decoder 19 of FIG. 14 generates control signals (decode signal) Axwa<s>,<s+1>; Axwb<s>,<s+1>; Ayp<t>,<t+1>; Ayn<t>,<t+1>; Axea<s>,<s+1>; Axeb<s>, <s+1>.

C. Memory Cell Array

FIG. 15 shows a memory cell array in detail.

Two diodes disposed in an opposite direction from each other are connected to resistance change elements disposed to an intersecting portion of a word line pair and a bit line.

Specifically, one ends of the resistance change elements MC1, MC2 are connected to a bit line BL1, and one ends of the resistance change elements MC3, MC4 are connected to a bit line BL2.

Diodes D1a, D1b are connected to the other end of the resistance change element MC1 in an opposite direction from each other. That is, an anode of the diode D1a is connected to a word line WL1a, and a cathode thereof is connected to the other end of the resistance change element MC1. An anode of the diode D1b is connected to the other end of the resistance change element MC1, and a cathode thereof is connected to the word line WL1b.

The diodes D2a, D2b are connected to the other end of the resistance change element MC2 in an opposite direction from each other. That is, an anode of the diode D2a is connected to a word line WL2a, and a cathode thereof is connected to the other end of the resistance change element MC2. An anode of a diode D2b is connected to the other end of the resistance change element MC2, and a cathode thereof is connected to a word line WL2b.

Diodes D3a, D3b are connected to the other end of the resistance change element MC3 in an opposite direction from each other. That is, an anode of the diode D3a is connected to a word line WL1a, and a cathode thereof is connected to the other end of the resistance change element MC3. An anode of the diode D3b is connected to the other end of the resistance change element MC3, and a cathode thereof is connected to the word line WL1b.

Diodes D4a, D4b are connected to the other end of the resistance change element MC4 in an opposite direction from each other. That is, an anode of the diode D4a is connected to the word line WL2a, and a cathode thereof is connected to the other end of the resistance change element MC4. An anode of the diode D4b is connected to the other end of the resistance change element MC4, and a cathode thereof is connected to the word line WL2b.

D. Operation

A write operation of the resistance change type memory of FIGS. 9 to 15 will be explained.

It is assumed here that the resistance change elements MC1 to MC4 store binary data, and a low resistance state is shown by "0" and a high resistance state is shown by "1". However, this definition is only an example.

Further, the resistance change element MC1 is used as a selected cell to which data is written. The other resistance change elements MC2 to MC4 are designated as non-selected cells to which data is not written.

FIRST EXAMPLE

When "1" is written, the word line WL1a is connected to the current source I1, and the bit line BL1 is grounded. That is, the word line WL1a is set to "H (high)" and the bit line BL1 is set to "L (low)".

In, for example, FIG. 9 as an example, it is sufficient that the control signals Axw<s>, SRCw are set to "L", the control signals Ayp<t>, Ayn<t>, SNKn are set to "H", P channel MOS transistors P1, P3 and N channel MOS transistors N4, N6 are turned on.

Figure 16:
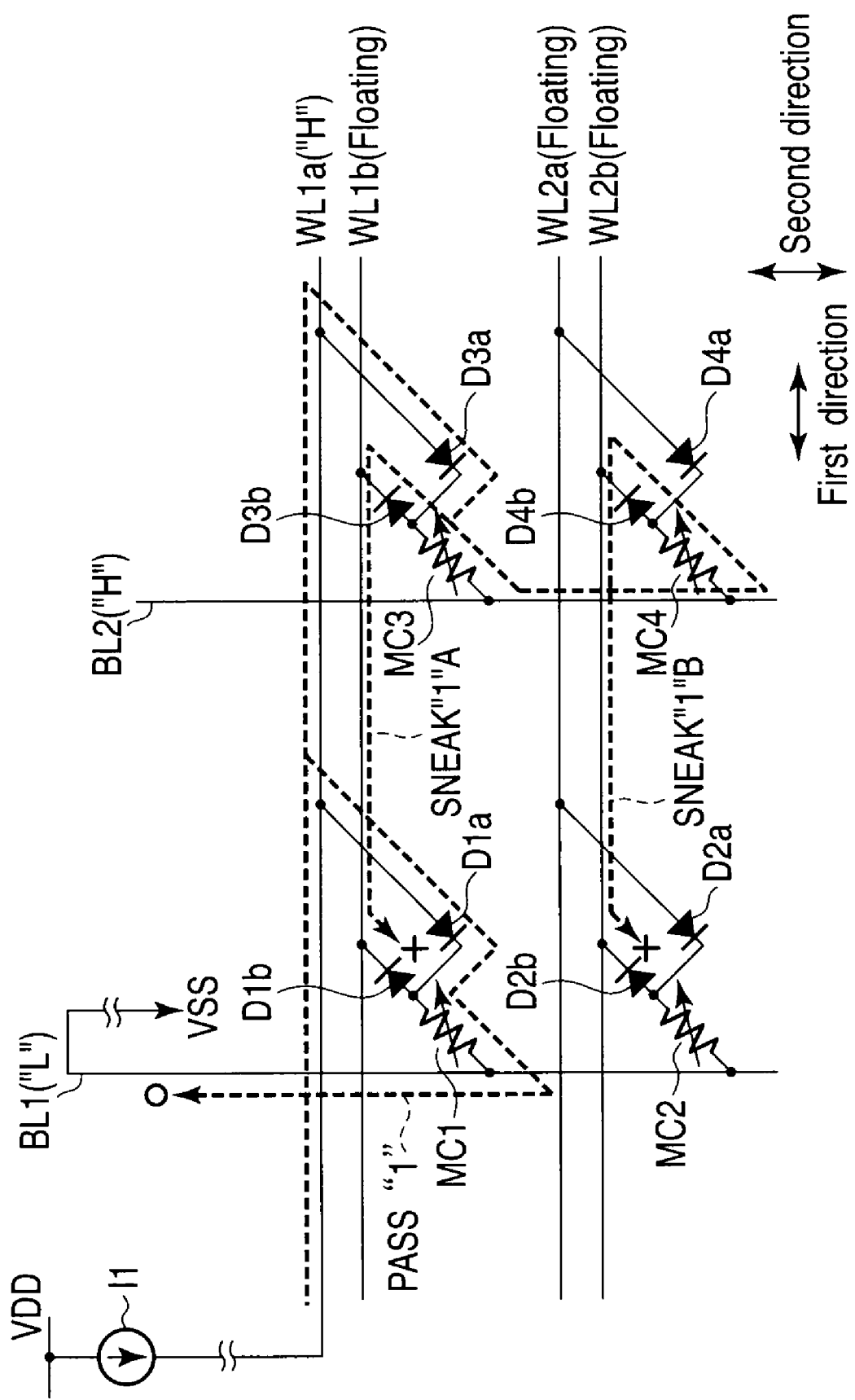
FIG. 16 is a view showing a current path when "1" is written.

At the time, as shown in FIG. 16, the write current is supplied from the current source I1 to the resistance change element MC1 through the word line WL1a and the diode D1a. Further, the write current is absorbed by the ground through the bit line BL1 (PASS "1").

Further, when "1" is written, for example, the non-selected word lines WL1b, WL2a, WL2b are caused to float, and the non-selected bit line BL2 is set to "H".

In, for example, FIG. 9 as the example, when the control signal Axw<s+1> is set to "H" and the control signals Axe<s>, Axe<s+1> are set to "L", since the P channel MOS transistors P2 and the N channel MOS transistors N1, N2 are turned off, the word lines WL1b, WL2a, WL2b are caused to float.

Further, when the control signals Ayp<t+1>, Ayn<t+1>, SRCn are set to "L", since the P channel MOS transistors P5, P6 are turned on and the N channel MOS transistor N5 is turned off, the bit line BL2 is set to "H".

As shown in FIG. 16, when "1" is written, there are generated a current path (SNEAK "1" B), which goes from the word line WL1a to the bit line BL2 through the resistance change element MC3 and further goes from the bit line BL2 to the word line WL2b through the resistance change element MC4, and a current path (SNEAK "1" A) which goes from the word line WL1a to the word line WL1b through the diode D3b.

However, the diode D1b, which is connected in a direction opposite to the direction of a current flowing in the current path (SNEAK "1" A), exists between the word line WL1b and the bit line BL1, and the diode D2b, which is connected in a direction opposite to the direction of a current flowing in the current path (SNEAK "1" B), exists between the word line WL2b and the bit line BL1. Accordingly, since these current paths do not reach the bit line BL1, a so-called sneak current is prevented.

Further, when "1" is written, word lines WL1b, WL2a, WL2b are caused to float, and the electric potential of the bit line BL2 is made equal to the electric potential ("H") of the word line WL1a.

A write current, which is generated by the current source I1, is prevented from flowing to the resistance change element MC3 as a sneak current by setting the bit line BL2 to "H". Further, a current path from the word line WL2a to the bit line BL1 is shut off by causing the word line WL2a to float. When the word lines WL1b, WL2b are caused to float, the electric potentials of the word lines WL1b, WL2b are made lower than the electric potential ("H") of the bit line BL2.

When "0" is written, the bit line BL1 is connected to the current source I2, and the word line WL1b is grounded. That is, the bit line BL1 is set to "H", and the word line WL1b is set to "L".

In, for example, FIG. 9 as the example, it is sufficient that the control signals Ayp<t>, Ayn<t>, SRCn are set to "L", the control signal Axe<s>, SNKe are set to "H", and the P channel MOS transistors P4, P6 and the N channel MOS transistors N1, N3 are turned on.

At the time, as shown in FIG. 17, the write current is supplied from the current source I2 to the resistance change element MC1 through the bit line BL1. Further, the write current is absorbed by the ground through the diode D1b and the word line WL1b (PASS "0").

Further, when "0" is written, for example, the non-selected bit line BL2 is set to "L", and the non-selected word lines WL1a, WL2a, WL2b are caused to float.

In, for example, FIG. 9 as the example, when the control signals Ayp<t+1>, Ayn<t+1>, SNKn are set to "H", since the N channel MOS transistor N5, N6 are turned on and the P channel MOS transistor P5 is turned off, the bit line BL2 is set to "L".

Further, when the control signal Axw<s>, Axw<s+1> are set to "H" and the control signal Axe<s+1> is set to "L", since the P channel MOS transistors P1, P2 and the N channel MOS transistor N2 are turned off, the word lines WL1a, WL2a, WL2b are caused to float.

Here, as shown in FIG. 17, when "0" is written, a current path (SNEAK "0"), which goes from the bit line BL1 to the word line WL2b through the resistance change element MC2, is generated.

However, since the diode D4b, which is connected in a direction opposite to the direction of a current flowing in the current path (SNEAK "0"), exists between the word line WL2b and the bit line BL2, the current path does not reach the bit line BL2, and thus a so-called sneak current is prevented.

Further, when "0" is written, the word lines WL1a, WL2a, WL2b are caused to float, and the electric potential of the bit line BL2 is made equal to the electric potential ("L") of the word line WL1b.

A current path from the bit line BL2 to the word line WL1b is shut off by setting the bit line BL2 to "L". Further, a current path from the word line WL1a to the word line WL1b is shut off by causing the word line WL1a to float, and a current path from the word line WL2a to the bit line BL2 is shut off by causing the word line WL2a to float. When the word line WL2b is caused to float, the electric potential of the word line WL2b is made lower than the electric potential ("H") of the bit line BL1.

SECOND EXAMPLE

When "1" is written, the word line WL1a is connected to the current source I1, and the bit line BL1 is grounded. That is, the word line WL1a is set to "H", and the bit line BL1 is set to "L".

In, for example, FIG. 12 as an example, it is sufficient that the control signals Axwa<s>, Axea<s>, SRCw are set to "L", the control signals Ayp<t>, Ayn<t>, SNKn are set to "H", and the P channel MOS transistors P1a, P3 and the N channel MOS transistors N4, N6 are turned on.

At the time, as shown in FIG. 18, the write current is supplied from the current source I1 to the resistance change element MC1 through the word line WL1a. The write current is absorbed by the ground through the bit line BL1 (PASS "1").

Further, when "1" is written, for example, the non-selected word lines WL1b, WL2b and the non-selected bit line BL2 is set to "H", and the non-selected word line WL2a is set to "L".

In, for example, FIG. 12 as the example, when the control signals Axwb<s>, Axwb<s+1>, Axeb<s>, Axeb<s+1> are set to "L" and the control signals Axwa<s+1>, Axea<s+1>, SNKe are set to "H", the word lines WL1b, WL2b are set to "H" and the word line WL2a is set to "L". Further, when the control signals Ayp <t+1>, Ayn <t+1>, SRCn are set to "L", the bit line BL2 is set to "H".

As shown in FIG. 18, when "1" is written, there are generated the current path (SNEAK "1" B), which goes from the word line WL1a to the bit line BL2 through the resistance change element MC3 and further goes from the bit line BL2 to the word line WL2b through the resistance change element MC4, and the current path (SNEAK "1" A) which goes from the word line WL1a to the word line WL1a through the diode D3b.

However, the diode D1b, which is connected in a direction opposite to the direction of a current flowing in the current path (SNEAK "1" A), exists between the word line WL1b and the bit line BL1, and the diode D2b, which is connected in a direction opposite to the direction of a current flowing in the current path (SNEAK "1" B), exists between the word line WL2b and the bit line BL1. Accordingly, since these current paths do not reach the bit line BL1, a so-called sneak current is prevented.

Further, when "1" is written, the electric potentials of the word line WL1b, WL2b and the electric potential of the bit line BL2 are made equal to the electric potential ("H") of the word line WL1a. Further, the electric potential of the word line WL2a is made equal to the electric potential ("L") of the bit line BL1.

A write current generated by the current source I1 is prevented from flowing to the resistance change element MC3 as a sneak current by setting the bit line BL2 to "H". Further, a current path from the word line WL2a to the bit line BL1 is shut off by setting the word line WL2a to "L". Even if the word lines WL1b, WL2b are set to "H", since the diodes D1b, D2b exist between the word lines WL1b, WL2b and the bit line BL1, a current path from the word lines WL1b, WL2b to the bit line BL1 is shut off.

When "0" is written, the bit line BL1 is connected to the current source I2, and the word line WL1b is grounded. That is, the bit line BL1 is set to "H", and the word line WL1b is set to "L".

In, for example, FIG. 12 as the example, the control signals Axwb<s>, Ayp<t>, Ayn<t>, SRCn are set to "L", the control signal Axeb<s>, SNKe are set to "H", and the P channel MOS transistors P4, P6 and the N channel MOS transistors N1b, N3 are turned on.

At the time, as shown in FIG. 19, the write current is supplied from the current source I2 to the resistance change element MC1 through the bit line BL1. Further, the write current is absorbed by the ground through the word line WL1b (PASS "0").

Further, when "0" is written, for example, the non-selected bit line BL2 and the non-selected word lines WL1a, WL2a are set to "L", and the non-selected word line WL2b is set to "H".

In, for example, FIG. 12 as the example, when the control signals Axwa<s>, Axwa<s+1>, Axea<s>, Axea<s+1>, SNKe are set to "H" and the control signals Axwb<s+1>, Axeb<s+1>, SRCw are set to "L", the word lines WL1a, WL2a are set to "L" and the word line WL2b is set to "H". Further, when the control signals Ayp<t+1>, Ayn<t+1>, SNKn are set to "H", the bit line BL2 is set to "L".

As shown in FIG. 19, when "0" is written, a current path (SNEAK "0"), which goes from the bit line BL1 to the word line WL2b through the resistance change element MC2, is generated.

However, since the diode D4b, which is connected in a direction opposite to the direction of a current flowing in the current path (SNEAK "0"), exists between the word line WL2b and the bit line BL2, the current path does not reach the bit line BL2, thereby a so-called sneak current is prevented.

Further, when "0" is written, the electric potentials of the word lines WL1a, WL2a and the electric potential of the bit line BL2 are made equal to the electric potential ("L") of the word line WL1b, and the electric potential of the word line WL2b is made equal to the electric potential ("H") of the bit line BL1.

A current path from the bit line BL2 to the word line WL1b is shut off by setting the bit line BL2 to "L". Further, a current path from the word line WL1a to the word line WL1b is shut off by setting the word line WL1a to "L", and a current path from the word line WL2a to the bit line BL2 is shut off by setting the word line WL2a to "L". Even if the word line WL2b is set to "H", since the diode D4b exists between the word line WL2b and the bit line BL2, a current path from the word line WL2b to the bit line BL2 is shut off.

In the second example, the electric potentials of the word lines WL1a, WL1b, WL2a, WL2b and the bit lines BL1, BL2 are controlled by a binary value of "H" and "L". In the first example, since "floating" is necessary in addition to "H" and "L", the controllability of the second example is improved as compared with the first example.

E. Device Structure

Examples of a device structure will be explained.

FIRST EXAMPLE

FIG. 20 shows a first example of the device structure.

An element separation insulation layer 22 having an STI (Shallow Trench Isolation) structure is formed in a semiconductor substrate 21. Diodes D1a, D1b, which are composed of n+ diffusion layers 23a, 23b and p+ diffusion layers 24a, 24b, are formed in an element region surrounded by the element separation insulation layer 22.

The p+ diffusion layer 24a as an anode of the diode D1a is connected to a word line WL1a through a plug 25, and the n+ diffusion layer 23a as a cathode thereof is connected to an intermediate conductive layer 29 through a plug 27.

The p+ diffusion layer 24b as an anode of the diode D1b is connected to the intermediate conductive layer 29 through a plug 28, and the n+ diffusion layer 23b as a cathode thereof is connected to the word line WL1b through a plug 26.

The intermediate conductive layer 29 is connected to a lower electrode 31 through a plug 30. A resistance change element MC1 is formed on the lower electrode 31.

The resistance change element MC1 is connected to a bit line BL1 through a cap conductive layer 32.

The above elements are covered by an insulation layer 33.

SECOND EXAMPLE

FIG. 21 shows a second example of the device structure.

The second example has a feature in that an SOI (Silicon on Insulator) substrate is used when compared with the first example. The other arrangements of the second example are the same as those of the first example.

An insulation layer 34 is formed on a semiconductor substrate 21. An element separation insulation layer 22 having an STI structure is formed on the insulation layer 34.

Diodes D1a, D1b are formed in an element region (semiconductor layer) surrounded by the insulation layers 22, 34.

The diode D1a is composed of an n+ diffusion layer 23a as a cathode and a p+ diffusion layer 24a as an anode, and the diode D1b is composed of an n+ diffusion layer 23b as a cathode and a p+ diffusion layer 24b as an anode.

In the structure, since the diodes D1a, D1b are completely surrounded by the insulation layers 22, 34, a leak current generated in the diodes D1a, D1b is prevented.

THIRD EXAMPLE

FIG. 22 shows a third example of the device structure.

Diodes D1a, D1b of the third example have a structure different from that of the first example. The other arrangements of the third example are the same as those of the first example.

N-well regions 35a, 35b are formed in an element region surrounded by an element separation insulation layer 22.

A diode D1a composed of an n+ diffusion layer 36a and a p+ diffusion layer 37a is formed in the n-well region 35a. Further, a diode D1b composed of an n+ diffusion layer 36b and a p+ diffusion layer 37b is formed in the n-well region 35b.

The p+ diffusion layer 37a as an anode of the diode D1a is connected to a word line WL1a through a plug 25, and the n+ diffusion layer 36a thereof as a cathode is connected to an intermediate conductive layer 29 through a plug 27.

The p+ diffusion layer 37b as an anode of the diode D1b is connected to the intermediate conductive layer 29 through the plug 28, and the n+ diffusion layer 36b thereof as a cathode is connected to the word line WL1b through the plug 26.

The structure is advantageous in that an off-leak is reduced although the diodes D1a, D1b are increased in size as compared with the first example.

FOURTH EXAMPLE

FIG. 23 shows a fourth example of the device structure.

The device structure of the fourth example is constructed by combining the device structures of the second and third examples.

Diodes D1a, D1b are formed on an SOI substrate.

The diode D1a is composed of an n+ diffusion layer 36a and a p+ diffusion layer 37a in an n-well region 35a. The diode D1b composed of an n+ diffusion layer 36b and a p+ diffusion layer 37b in an n-well region 35b.

Since diffusion of impurities can be suppressed by using the SOI substrate, the distance between the diodes D1a, D1b can be reduced while sufficiently securing an element separation function.

FIFTH EXAMPLE

Figure 24:
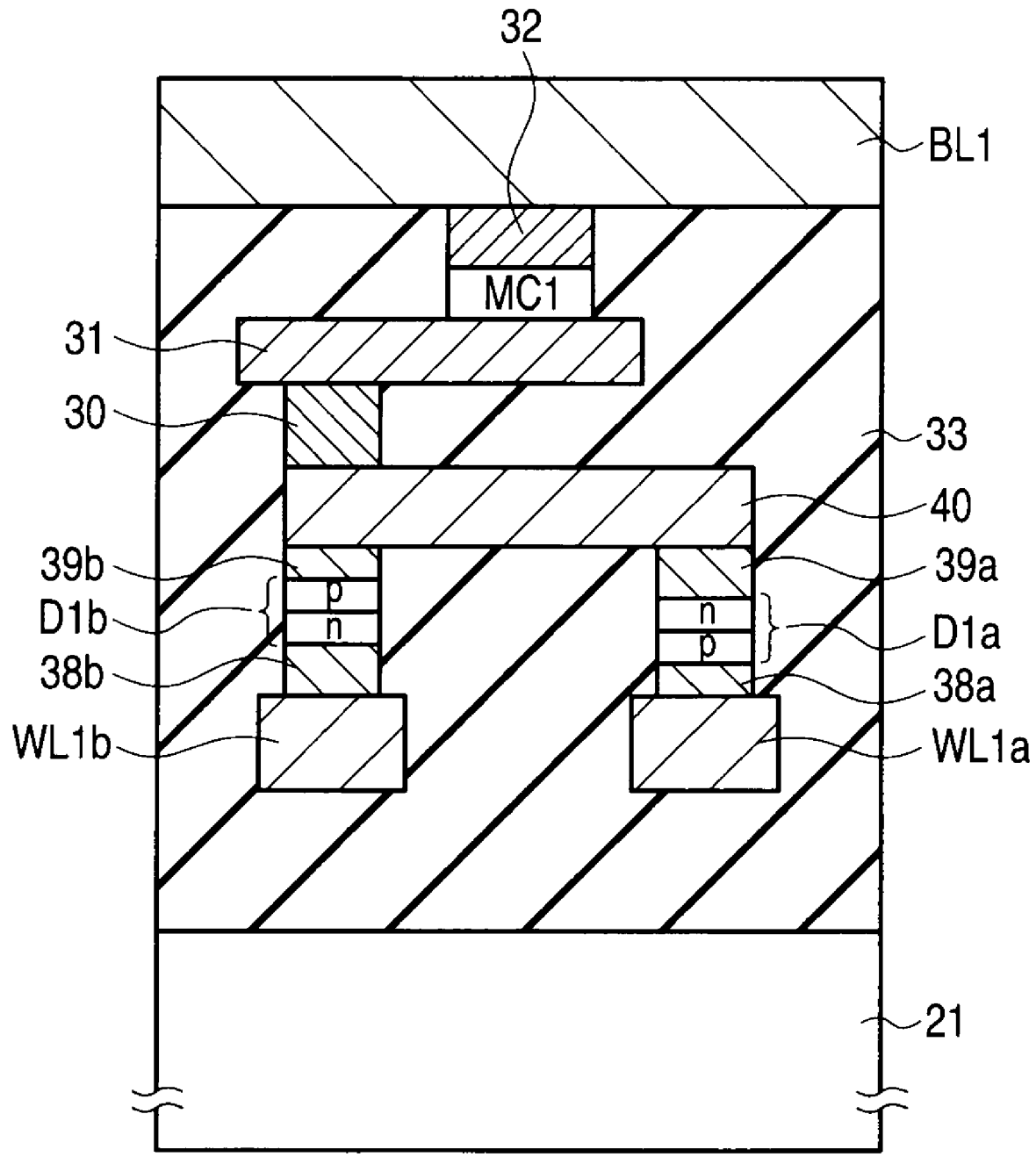
FIG. 24 is a view showing a fifth example of the device structure.

FIG. 24 shows a fifth example of the device structure.

The fifth example relates to a diode.

Word lines WL1a, WL1b are formed on a semiconductor substrate 21.

A lower electrode 38a is formed on the word line WL1a, and a diode D1a, which is composed of a p-type semiconductor and an n-type semiconductor, is formed on the lower electrode 38a. An upper electrode 39a is formed on the diode D1a.

A lower electrode 38b is formed on the word line WL1b, and a diode D1b, which is composed of an n-type semiconductor and a p-type semiconductor, is formed on the lower electrode 38b. An upper electrode 39b is formed on the diode D1b.

The diodes D1a, D1b are located between the word lines WL1a, WL1b and the bit line BL1.

An intermediate conductive layer 40 is formed on the upper electrode 39a, 39b to connect them. The intermediate conductive layer 40 is connected to the lower electrode 31 through a plug 30. A resistance change element MC1 is formed on the lower electrode 31.

The resistance change element MC1 is connected to the bit line BL1 through a cap conductive layer 32.

The above elements are covered by an insulation layer 33.

The diodes have an advantage in that the size thereof can be reduced as compared with the diodes formed by the diffusion layers in the semiconductor substrate as shown by the first to fourth examples.

F. Conclusion

As described above, according to the first embodiment, the two diodes, which are disposed in an opposite direction from each other, are connected to one resistance change element. Further, when the first data is written to the resistance change element, the write current is caused to flow to one of the two diodes in the forward direction, and when the second data is written thereto, the write current is caused to flow to the other of the two diodes in the forward direction. With this arrangement, disturb and retention can be improved at the same time when data is written.

(2) Second Embodiment

A second embodiment shows a specific arrangement of the eighth basic architecture (FIG. 8).

A. Circuit Arrangement

Figure 25:
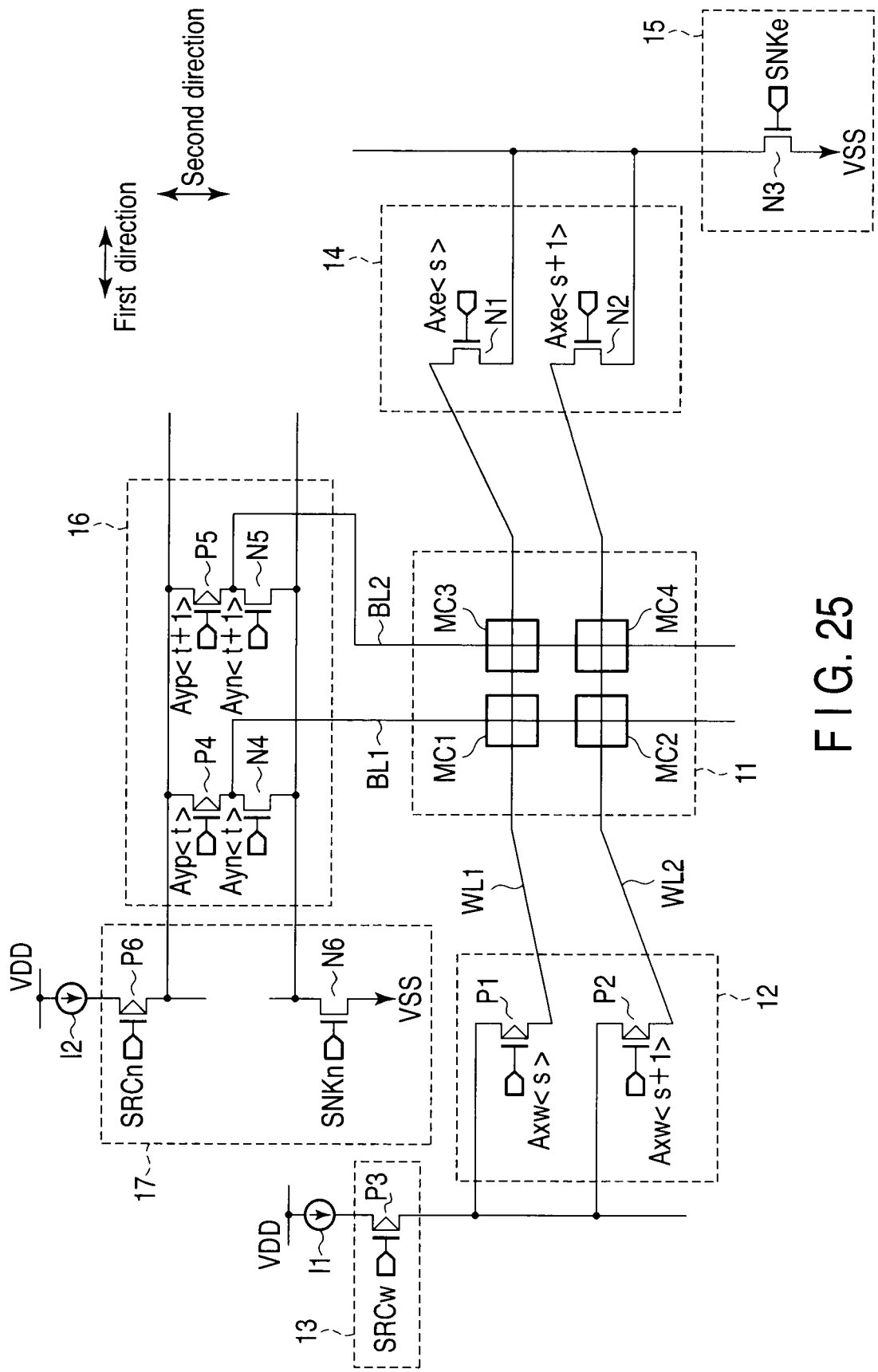
FIG. 25 is a view showing a resistance change type memory of a second embodiment.

FIG. 25 shows a write circuit of the resistance change type memory of the present invention.

A memory cell array 11 is composed of a plurality of memory cells. Four memory cells MC1, MC2, MC3, MC4 are shown here for simplification.

The memory cells MC1, MC2, MC3, MC4 are resistance change elements.

Word lines WL1, WL2 extending in a first direction are disposed on the memory cell array 11. The word line WL1 is disposed in correspondence to the memory cells MC1, MC3, and the word line WL2 is disposed in correspondence to memory cells MC2, MC4.

One ends of the word lines WL1, WL2 are connected to a word line driver 13 through a word line selector 12.

The word line selector 12 is composed of P channel MOS transistors P1, P2 having gates to which control signals Axw<s>, Axw<s+1> are input. The word line driver 13 is composed of a P channel MOS transistor P3 having a gate to which a control signal SRCw is input.

A current source I1 generates a write current.

Further, the other ends of the word lines WL1, WL2 are connected to a word line sinker 15 through a word line selector 14.

The word line selector 14 is composed of N channel MOS transistors N1, N2 having gates to which control signals Axe<s>, Axe<s+1> are input. The word line sinker 15 is composed of an N channel MOS transistor N3 having a gate to which a control signal SNKe is input.

Further, bit lines BL1, BL2, which extend in a second direction intersecting a first direction, are disposed on the memory cell array 11. The bit line BL1 is disposed in correspondence to the memory cells MC1, MC2, and the bit line BL2 is disposed in correspondence to the memory cells MC3, MC4.

One ends of the bit lines BL1, BL2 are connected to a bit line driver/sinker 17 through a bit line selector 16. The other ends of the bit lines BL1, BL2 are placed in, for example, an open state.

The bit line selector 16 is composed of P channel MOS transistors P4, P5 having gates to which control signals Ayp<t>, Ayp<t+1> are input and N channel MOS transistors N4, N5 having gates to which control signals Ayn<t>, Ayn<t+1> are input.

The word line driver/sinker 17 is composed of a P channel MOS transistors P6 having a gate to which a control signal SRCn is input and an N channel MOS transistor N6 having a gate to which a control signal SNKn is input.

A current source I2 generates a write current.

The control signals SRCw, SRCn, SNKn, SNKe are created by a write control circuit 18 of FIG. 10. Further, the control signals Axw<s>,<s+1>; Ayp<t>,<t+1>; Ayn<t>,<t+1>; Axe<s>,<s+1> are created by a decoder 19 of FIG. 11.

B. Memory Cell Array

FIG. 26 shows the memory cell array in detail.

One ends of the resistance change elements MC1, MC2 are connected to a bit line BL1, and one ends of the resistance change elements MC3, MC4 are connected to a bit line BL2.

An anode of a zener diode ZD1 is connected to the other end of the resistance change element MC1, and a cathode thereof is connected to the word line WL1. An anode of a zener diode ZD2 is connected to the other end of the resistance change element MC2, and a cathode thereof is connected to the word line WL2.

An anode of a zener diode ZD3 is connected to the other end of the resistance change element MC3, and a cathode thereof is connected to the word line WL1. An anode of a zener diode ZD4 is connected to the other end of the resistance change element MC4, and a cathode thereof is connected to the word line WL2.

Note that the zener diodes ZD1 to ZD4 may be connected in an opposite direction, i.e. the cathodes thereof may be connected to the resistance change element.

C. Operation

A write operation of the resistance change type memory of FIGS. 25 to 26 will be explained.

It is assumed here that the resistance change elements MC1 to MC4 store binary data, and a low resistance state is shown by "0" and a high resistance state is shown by "1". However, this definition is only an example.

Further, the resistance change element MC1 is used as a selected cell to which data is written. The other resistance change elements MC2 to MC4 are designated as non-selected cells to which data is not written.

When "1" is written, the word line WL1 is connected to the current source I1, and the bit line BL1 is grounded. That is, the word line WL1 is set to "H", and the bit line BL1 is set to "L".

In this case, it is sufficient that the control signals Axw<s>, SRCw are set to "L", the control signals Ayp<t>, Ayn<t>, SNKn are set to "H", and the P channel MOS transistors P1, P3 and the N channel MOS transistors N4, N6 are turned on.

At the time, as shown in FIG. 27, the write current is supplied from the current source I1 to the resistance change element MC1 through the word line WL1. Since a voltage equal to or more than the zener voltage thereof is applied to the zener diode ZD1, the write current flows in an opposite direction by the zener effect. The write current is absorbed by the ground through the bit line BL1 (PASS "1").

Further, when "1" is written, for example, the non-selected word line WL2 and the non-selected bit line BL2 are caused to float.

In this case, the control signal Axw<s+1> is set to "H", the control signal Axe<s+1> is set to "L", and the P channel MOS transistor P2 and the N channel MOS transistor N2 are turned off. Further, the control signal Ayp<t+1> is set to "H", the control signal Ayn<t+1> is set to "L", and the P channel MOS transistor P5 and the N channel MOS transistor N5 are turned off.

Here, as shown in FIG. 27, when "1" is written, a current path (PASS "sneak") is generated from the word line WL1 to the resistance change element MC3.

Thus, a condition when data is written is set so that the voltage applied to the zener diodes ZD1 to ZD4 satisfies the following relation.

First, it is premised that the potential difference between the word line WL1 and the bit line BL1 is Vlw, and the forward voltage of the zener diodes ZD1 to ZD4 is Vldf, and the reverse voltage thereof is Vldr. Further, the voltage applied to each of the resistance change elements MC1 to MC4 is Vmtj for simplification.

In this case, the following equation is established in a current path from the word line WL1 to the bit line BL1 through the resistance change element MC1.

$$Vlw = Vldr + Vmtj$$

Accordingly, it is sufficient to set Vlw, Vzv so that they satisfy the following equation in order to apply a voltage equal to or more than the zener voltage Vzv to the zener diode ZD1.

$$Vldr = Vlw - Vmtj \geq Vzv$$

In contrast, it is sufficient to set Vlw so that a voltage less than the zener voltage Vzv thereof is applied to the zener diodes ZD2, ZD3 in order to shut off a current path (sneak pass) PASS "sneak" from the word line WL1 to the bit line BL1 through the resistance change element MC3, the bit line BL2, the resistance change element MC4, the word line WL2, and the resistance change element MC2 in this order.

Specifically, in the sneak pass PASS "sneak", the following equation is established.

$$Vlw = 3Vmtj + 2Vldr + Vldf$$

Accordingly, it is sufficient to set Vlw, Vzv so that they satisfy the following equation in order to apply a voltage less than the zener voltage Vzv thereof to the zener diodes ZD2, ZD3.

$$Vldr = Vlw/2 - 3Vmtj/2 - Vldf/2 < Vzv$$

As a result, the write current can be caused to flow only to the current path PASS "1". When "0" is written, the bit line BL1 is connected to the current source I2, and the word line WL1 is grounded. That is, the bit line BL1 is set to "H", and the word line WL1 is set to "L".

In this case, it is sufficient that the control signals Ayp<t>, Ayn<t>, SRCn are set to "L", the control signals Axe<s>, SNKe are set to "H", and the P channel MOS transistors P4, P6 and the N channel MOS transistors N1, N3 are turned on.

At the time, as shown in FIG. 28, the write current is supplied from the current source I2 to the resistance change element MC1 through the bit line BL1. The write current flows to the zener diode ZD1 in a forward direction. Further, the write current is absorbed by the ground through the word line WL1 (PASS "0").

Further, when "0" is written, for example, the non-selected bit line BL2 and the non-selected word line WL2 are caused to float.

In this case, the control signal Ayp<t+1> is set to "H", the control signal Ayn<t+1> is set to "L", and the P channel MOS transistor P5 and the N channel MOS transistor N5 are turned off. Further, the control signal Axw<s+1> is set to "H", the control signal Axe<s+1> is set to "L", and the P channel MOS transistor P2 and the N channel MOS transistor N2 are turned off.

Here, as shown in FIG. 28, when "0" is written, a current path (PASS "sneak"), which goes from the bit line BL1 to the word line WL2 through the resistance change element MC2, is generated.

Thus, a condition when data is written is set so that the voltage applied to the zener diodes ZD1 to ZD4 satisfies the following relation.

First, it is premised that the potential difference between the word line WL1 and the bit line BL1 is Vlw, and the forward voltage of the zener diodes ZD1 to ZD4 is Vldf and the reverse voltage thereof is Vldr. Further, the voltage applied to each of the resistance change elements MC1 to MC4 is Vmtj for simplification.

In this case, the following equation is established in a current path from the bit line BL1 to the word line WL1 through the resistance change element MC1.

$$Vlw = Vldf + Vmtj$$

In contrast, it is sufficient to set Vlw so that a voltage less than the zener voltage Vzv is applied to the zener diode ZD4 in order to shut off a current path (sneak pass) PASS "sneak" from the bit line BL1 to the word line WL1 through the resistance change element MC2, the word line WL2, the resistance change element MC4, the bit line BL2, and the resistance change element MC3 in this order.

Specifically, the following equation is established in the sneak pass PASS "sneak".

$$Vlw = 3Vmtj + Vldr + 2Vldf$$

Accordingly, it is sufficient to set Vlw, Vzv so that they satisfy the following equation in order to apply a voltage less than the zener voltage Vzv to the zener diode ZD4.

$$Vldr = Vlw - 3Vmtj - 2Vldf < Vzv$$

As a result, the write current can be caused to flow only to the current path PASS "0".

Note that as to the voltage Vmtj applied to the resistance change elements MC1 to MC4, when "0" is written, a value, by which the resistance change element MC1 can be changed from a high resistance state to a low resistance state, is set, and when "1" is written, a value, by which the resistance change element MC1 can be changed from the low resistance state to the high resistance state, is set.

The value of the zener voltage Vzv can be controlled by the density of the impurities of a p-type semiconductor layer and an n-type semiconductor layer that constitute the zener diodes.

Incidentally, in the present invention, a sneak current in a read operation can be also prevented by the same principle. In the read operation, a read current smaller than the write current is used.

In this operation, it is essential to cause the non-selected word line WL2 to float when "1" is written and when "0" is written.

However, as shown in FIG. 29, the non-selected bit line BL2 may be set to "H" when "1" is written. In this case, it is sufficient to set the control signals Ayp<t+1>, Ayn<t+1>, SRCn to "L". When the non-selected bit line BL2 is set to "H", since no voltage is applied to the zener diode ZD3, a current path from the word line WL1 to the bit line BL2 is shut off.

Further, as shown in FIG. 30, the non-selected bit line BL2 may be set to "L" when "0" is written. In this case, it is sufficient to set the control signals Ayp<t+1>, Ayn<t+1>, SNKn to "H".

In any of the cases, since a write control can be carried out by a binary value of "H" and "L", controllability can be more improved than a case that the write control is carried out by a ternary value of "H", "L" and "Floating".

D. Device Structure

Examples of a device structure will be explained.

FIRST EXAMPLE

FIG. 31 is a view showing a first example of the device structure.

In a semiconductor substrate 21, an element separation insulation layer 22 having an STI structure is formed. A zener diode ZD1, which is composed of an n+ diffusion layer 23 and a p+ diffusion layer 24, is formed in an element region surrounded by an element separation insulation layer 22.

The p+ diffusion layer 24 as an anode of the zener diode ZD1 is connected to a lower electrode 31 through a plug 28, and the n+ diffusion layer 23 as a cathode thereof is connected to a word line WL1 through a plug 26.

A resistance change element MC1 is formed on the lower electrode 31.

The resistance change element MC1 is connected to a bit line BL1 through a cap conductive layer 32.

The above elements are covered by an insulation layer 33.

SECOND EXAMPLE

FIG. 32 shows a second example of the device structure.

The second example relates to a diode.

A word line WL1 is formed on a semiconductor substrate 21.

A lower electrode 38 is formed on the word line WL1, and a zener diode ZD1, which is composed of an n-type semiconductor and a P-type semiconductor, is formed on the lower electrode 38. An upper electrode 39 is formed on the zener diode ZD1.

The zener diode ZD1 is located between the word lines WL1 and the bit line BL1.

A lower electrode 31 is formed on the upper electrode 39. A resistance change element MC1 is formed on the lower electrode 31.

The resistance change element MC1 is connected to the bit line BL1 through a cap conductive layer 32.

The above elements are covered by an insulation layer 33.

The diode is advantageous in that a size can be reduced as compared with the diode as shown in the first example which is formed by the diffusion layer in the semiconductor substrate.

Others

The zener diode according to the present invention may be formed on the SOI substrate shown in the second example having the device structure of the first embodiment or may be formed in the well region shown in the third example having the device structure of the first embodiment.

E. Conclusion

According to the second embodiment described above, data can be written to the zener diode by energizing it bidirectionally as well as a sneak current can be prevented by the zener effect of the zener diode. With this arrangement, disturb and retention can be improved at the same time when data is written.

(3) Others

The diodes or the zener diodes used in the first and second embodiment may be schottky diodes.

4. Examples To Which Present Invention is Applied

The present invention can be applied to a resistance change type memory such as MRAM and ReRAM.

A memory cell of the resistance change type memory has such characteristics that it exhibits a different resistance value depending on a direction in which a current flows therein or a direction in which a voltage is applied thereto, and data is stored by the different resistance value.

FIG. 33 shows a basic structure of a memory cell of MRAM.

The memory cell (magneto-resistive element) of the MRAM is composed of a pinned layer 41, a free layer 42, and a tunnel barrier layer 43 interposed therebetween.

The memory cell is, for instance, a MTJ (magnetic tunnel junction) element.

The pinned layer 41 and the free layer 42 are composed of a ferromagnetic body. The magnetization direction of the pinned layer 41 and the free layer 42 may be a horizontal direction to a film surface as shown in a part (a) of the figure or a vertical direction to the film surface as shown in a part (b) of the figure.

The pinned layer 41 and the free layer 42 may be arranged reversely in a vertical direction.

In MRAM, a spin-injection writing system, for example, can be employed as a writing system. In this case, the direction of a write current is adjusted with respect to write data.

For instance, to magnetize the pinned layer 41 and the free layers 42 in the same direction (parallel state: low resistance), it is sufficient to flow electrons from the pinned layer 41 side to the free layer 42 side. In this case, since the electrons, which are spin polarized in the same direction as the magnetization direction of the pinned layer 41, apply spin torque to the electrons in the free layer 42, the relation between the pinned layer 41 and the free layer 42 is placed in a parallel state.

Further, to magnetize the pinned layer 41 and the free layer 42 in a reverse direction from each other (anti-parallel state: high resistance), it is sufficient to flow electrons from the free layer 42 side to the pinned layer 41 side. In this case, since the electrons, which are spin polarized in a direction reverse to the magnetization direction of the pinned layer 41, are reflected on the pinned layer 41 and applies spin torque to the electrons in the free layer 41, the relation between the pinned layer 41 and the free layer 42 is placed in an anti-parallel state.

When the memory cell of FIG. 33 is applied to the devices of FIGS. 20-24, 31 and 32, the memory cell where the pinned layer 41 is located at a downside (a semiconductor substrate side) and the free layer 42 is located at an upside is a bottom pin type. In this case, Electrons flow from the word line to the bit line to magnetize the pinned layer 41 and the free layers 42 in the parallel state, and Electrons flow from the bit line to the word line to magnetize the pinned layer 41 and the free layers 42 in the anti-parallel state.

On the contrary, the memory cell where the free layer 42 is located at a downside and the pinned layer 41 is located at an upside is a top pin type. In this case, Electrons flow from the bit line to the word line to magnetize the pinned layer 41 and the free layers 42 in the parallel state, and Electrons flow from the word line to the bit line to magnetize the pinned layer 41 and the free layers 42 in the anti-parallel state.

FIG. 34 shows a basic structure of a memory cell of ReRAM.

The memory cell of ReRAM is composed of a lower electrode 61, an upper electrode 63, and a resistance change film 62 interposed therebetween.

The following materials can be used as the resistance change film 62. The materials are, for example, amorphous oxides (oxides of one or more element selected from, for example, Ti, V, Fe, Co, Y, Zr, Nb, Mo, Hf, Ta, W, Ge, Si). The resistance change film 62 is clamped between an electrode of Ag or Cu and an electrode of TiW, Ti, W, and the like, and a current direction is changed by applying a voltage having a different polarity thereto. As a result, the resistance value of the resistance change film 62 can be changed by ionizing Ag or Cu as an electrode material, diffusing them in a thin film, and returning them to the electrode.

More specifically, when a voltage is applied so that the electrode side of Ag or Cu is set to a positive electric potential, Ag or Cu is ionized from the electrode and diffused in the resistance change film 62, coupled with electrons on the opposite side electrode, and precipitated. With this operation, since a current path containing a lot of Ag or Cu is formed in the resistance change film 62, the resistance of the resistance change film 62 is reduced.

In contrast, when a voltage is applied so that the electrode side of Ag or Cu is set to a negative electric potential, since Ag or Cu, which constitutes the current path formed in the resistance change film 62, reversely migrates in the resistance change film 62 returns to the electrode of Ag or Cu, the resistance of the resistance change film 62 is increased.

Further, an arrangement using the following materials can be employed in addition to the above example. More specifically, metal oxides (excluding $WO_3$) composed of at least one kind of element of the transition metal elements of group VI is used as the material of the resistance change film 62.

Specifically, $Cr_2O_3$, $CrO_2$, $MoO_2$, $MO_2O_5$, $WO_2$, a mixed crystal of $Cr_2O_3$ and $CrO_2$, a mixed crystal of $MoO_2$ and $MO_2O_5$, a mixed crystal of $WO_2$ and $WO_3$, and the like are used.

Further, metal oxides composed of at least one kind of element of the transition metal elements of group VI and at least one kind of element of the transition metal elements of group I, group II, group VII, and group VIII may be used as the material of the resistance change film 62.

Specifically, $NiCr_2O_4$, $MnCr_2O_4$, $FeCr_2O_4$, $CoCr_2O_4$, $CuCr_2O_4$, $ZnCr_2O_4$, and the like are used.

Note that it is preferable that these metal oxides are not amorphous and are polycrystal or microcrystal. The resistance of the resistance change film 62 can be increased or reduced by changing a current direction by applying a voltage having a different polarity to these materials.

ReRAM can employ a writing method of changing a resistance value by a current or a writing method of changing the resistance value by a voltage.

Note that only the basic structure of the memory cell of the resistance change type memories such as MRAM and ReRAM is shown above, and the basic structure can be variously modified.

5. Conclusion

According to the present invention, a writing technology for improving disturb and retention at the same time can be realized.

When an element size is made to several tens of nano meters by miniaturizing a memory cell, since a gate width of a selected transistor corresponding to the element size is also miniaturized, a drive current which can be caused to flow is reduced. A diode has a larger effective sectional area of a channel, to which a current flows, than a MOS transistor. Accordingly, a current, which can be caused to flow to a resistance change element, can be increased by using the diode in place of a selected transistor.

In general, since a correlation exists between a data-retention period and a current necessary to writing, an element having a good data-retention period has an increased current necessary to write data. Accordingly, the data-retention period can be increased by increasing a current which can be caused to flow to the resistance change element.

Further, since the ratio between a read current and a write current can be increased, erroneous writing (read disturb) when data is read can be prevented.

Further, a problem of deterioration of a reading sensitivity due to a sneak current and a problem of reduction of an operation speed can be avoided. High speed writing of about 10 ns or less can be realized by setting the difference of the electric potentials between the bit line and the word line to a value sufficiently larger than a threshold value necessary to writing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change type memory comprising:
first and second drive lines extending in a first direction;
a third drive line extending in a second direction intersecting the first direction;
a first resistance change element having one end connected to the third drive line;
a first diode having an anode connected to the first drive line and a cathode connected to other end of the first resistance change element;
a second diode having an anode connected to other end of the first resistance change element and a cathode connected to the second drive line;
a driver/sinker which supplies a write current to the first resistance change element; and
a write control circuit arranged such that when first data is written to the first resistance change element, the write current is caused to flow in a direction from the first drive line to the third drive line, and when second data is written to the first resistance change element, the write current is caused to flow in a direction from the third drive line to the second drive line.

2. The memory according to claim 1, further comprising:
fourth and fifth drive lines extending in the first direction;
a sixth drive line extending in the second direction;
a second resistance change element having one end connected to the third drive line;
a third diode having an anode connected to the fourth drive line and a cathode connected to other end of the second resistance change element;
a fourth diode having an anode connected to other end of the second resistance change element and a cathode connected to the fifth drive line;
third and fourth resistance change elements having one ends connected to the sixth drive line;
a fifth diode having an anode connected to the first drive line and a cathode connected to other end of the third resistance change element;
a sixth diode having an anode connected to other end of the third resistance change element and a cathode connected to the second drive line;
a seventh diode having an anode connected to the fourth drive line and a cathode connected to other end of the fourth resistance change element; and
an eighth diode having an anode connected to other end of the fourth resistance change element and a cathode connected to the fifth drive line,
wherein when the first data is written to the first resistance change element the write control circuit causes the second, fourth, and fifth drive lines to float and makes the electric potential of the sixth drive line equal to the electric potential of the first drive line, and when the second data is written to the first resistance change element, the write control circuit causes the first, fourth, and fifth drive lines to float and makes the electric potential of the sixth drive line equal to the electric potential of the second drive line.

3. The memory according to claim 1, further comprising:
fourth and fifth drive lines extending in the first direction;
a sixth drive line extending in the second direction;
a second resistance change element having one end connected to the third drive line;
a third diode having an anode connected to the fourth drive line and a cathode connected to other end of the second resistance change element;

a fourth diode having an anode connected to other end of the second resistance change element and a cathode connected to the fifth drive line;

third and fourth resistance change elements having one ends connected to the sixth drive line;

a fifth diode having an anode connected to the first drive line and a cathode connected to other end of the third resistance change element;

a sixth diode having an anode connected to other end of the third resistance change element and a cathode connected to the second drive line;

a seventh diode having an anode connected to the fourth drive line and a cathode connected to other end of the fourth resistance change element; and an eighth diode having an anode connected to other end of the fourth resistance change element and a cathode connected to the fifth drive line, wherein when the first data is written to the first resistance change element, the write control circuit makes the electric potentials of the second, fifth, and sixth drive lines equal to the electric potential of the first drive line and makes the electric potential of the fourth drive line equal to the electric potential of the third drive line, and when the second data is written to the first resistance change element, the write control circuit makes the electric potentials of the first, fourth, and sixth drive lines equal to the electric potential of the second drive line and makes the electric potential of the fifth drive line equal to the electric potential of the third drive line.

4. The memory according to claim 1, wherein the first and second diodes are formed in a semiconductor layer on an insulation layer, respectively.

5. The memory according to claim 1, wherein the first and second diodes are diodes located between the first and second drive lines and the third drive line, respectively.

6. The memory according to claim 1, wherein the first and second diodes are schottky diodes, respectively.

7. The memory according to claim 1, wherein the first resistance change element comprises oxides of one or more element selected from Ti, V, Fe, Co, Y, Zr, Nb, Mo, Hf, Ta, W, Ge, Si.

8. The memory according to claim 7, wherein the first resistance change element is interposed between an electrode comprising one of Ag and Cu and an electrode comprising one of TiW, Ti, and W.

9. The memory according to claim 1, wherein the first resistance change element comprises one of $Cr_2O_3$, $CrO_2$, $MoO_2$, $Mo_2O_5$, $WO_2$, a mixed crystal of $Cr_2O_3$ and $CrO_2$, a mixed crystal of $MoO_2$ and $Mo_2O_5$, and a mixed crystal of $WO_2$ and $WO_3$.

10. The memory according to claim 1, wherein the first resistance change element comprises one of $NiCr_2O_4$, $MnCr_2O_4$, $FeCr_2O_4$, $CoCr_2O_4$, $CuCr_2O_4$, and $ZnCr_2O_4$.

11. The memory according to claim 1, wherein the first resistance change element is a magneto-resistive element.

12. A resistance change type memory comprising:
first and second drive lines extending in a first direction;
third and fourth drive lines extending in a second direction intersecting the first direction;
first and second resistance change elements having one ends connected to the third drive line;
third and fourth resistance change elements having one ends connected to the fourth drive line;
a first zener diode having an anode connected to other end of the first resistance change element and a cathode connected to the first drive line;
a second zener diode having an anode connected to other end of the second resistance change element and a cathode connected to the second drive line;
a third zener diode having an anode connected to other end of the third resistance change element and a cathode connected to the first drive line;
a fourth zener diode having an anode connected to other end of the fourth resistance change element and a cathode connected to the second drive line;
a driver/sinker which supplies a write current to the first resistance change element; and
a write control circuit arranged such that when first data is written to the first resistance change element, the write current is caused to flow in a direction from the first drive line to the third drive line, and when second data is written to the first resistance change element, the write current is caused to flow in a direction from the third drive line to the first drive line,
wherein when the first and second data are written to the first resistance change element, the write control circuit causes the second drive line to float,
the write current is set to a first value when the first data is written to the first resistance change element as well as set to a second value when the second data is written to the first resistance change element,
the first value is such a value that a voltage applied to the first zener diode is made equal to or larger than the zener voltage thereof and a voltage applied to the second or third zener diode is made less than the zener voltage thereof, and
the second value is such a value that a voltage applied to the fourth zener diode is made less than the zener voltage thereof.

13. The memory according to claim 12, wherein when the first and second data are written, the write control circuit causes the fourth drive line to float.

14. The memory according to claim 12, wherein when the first and second data are written, the write control circuit makes the electric potential of the fourth drive line equal to the electric potential of the first drive line.

15. The memory according to claim 12, wherein the first to fourth diodes are formed in a semiconductor layer on an insulation layer, respectively.

16. The memory according to claim 12, wherein the first to fourth diodes are diodes located between the first and second drive lines and the third and fourth drive line, respectively.

17. The memory according to claim 12, wherein the first to fourth diodes are schottky diodes, respectively.

18. The memory according to claim 12, wherein each of the first to fourth resistance change elements comprises oxides of one or more element selected from Ti, V, Fe, Co, Y, Zr, Nb, Mo, Hf, Ta, W, Ge, Si.

19. The memory according to claim 18, wherein each of the first to fourth resistance change elements is interposed between an electrode comprising one of Ag and Cu and an electrode comprising one of TiW, Ti, and W.

20. The memory according to claim 12, wherein each of the first to fourth resistance change elements comprises one of $Cr_2O_3$, $CrO_2$, $MoO_2$, $Mo_2O_5$, $WO_2$, a mixed crystal of $Cr_2O_3$ and $CrO_2$, a mixed crystal of $MoO_2$ and $Mo_2O_5$, and a mixed crystal of $WO_2$ and $WO_3$.

21. The memory according to claim 12, wherein each of the first to fourth resistance change elements comprises one of $NiCr_2O_4$, $MnCr_2O_4$, $FeCr_2O_4$, $CoCr_2O_4$, $CuCr_2O_4$, and $ZnCr_2O_4$.

22. The memory according to claim 12, wherein each of the first to fourth resistance change elements is a magneto-resistive element.

* * * * *